United States Patent [19]

Ronen

[11] 4,288,801
[45] Sep. 8, 1981

[54] MONOLITHIC HVMOSFET ACTIVE SWITCH ARRAY

[75] Inventor: Ram S. Ronen, Placentia, Calif.

[73] Assignee: Xerox Corporation, Stamford, Conn.

[21] Appl. No.: 43,563

[22] Filed: May 30, 1979

[51] Int. Cl.$^3$ .............................................. H01L 27/02
[52] U.S. Cl. ........................................ 357/41; 357/23; 357/45; 357/46; 357/51; 357/52; 357/55
[58] Field of Search ....................... 357/41, 45, 46, 23, 357/52, 51, 55

[56] References Cited

U.S. PATENT DOCUMENTS 4,070,653  1/1978  Rao et al. ................................ 357/90

*Primary Examiner*—Edward J. Wojciechowicz

[57] ABSTRACT

Integrated monolithic arrays of high voltage metal oxide semiconductor field effect transistors having closed geometry grounded peripheries for interdevice isolation are able to function as drivers that may be switched on and off. The HVMOSFET'S include DMOS-like structures with separate channel and drift regions, closed geometry configurations with center drains, and split oxide topography having relatively thick oxide under a field plate and over a drift region for surface depletion and high voltage field inversion preclusion respectfully. The infra described HVMOSFET includes an active load operatively connected in cascade and connecting to a device switch for forming an integrated HV Active Switch in a monolithic array.

9 Claims, 37 Drawing Figures

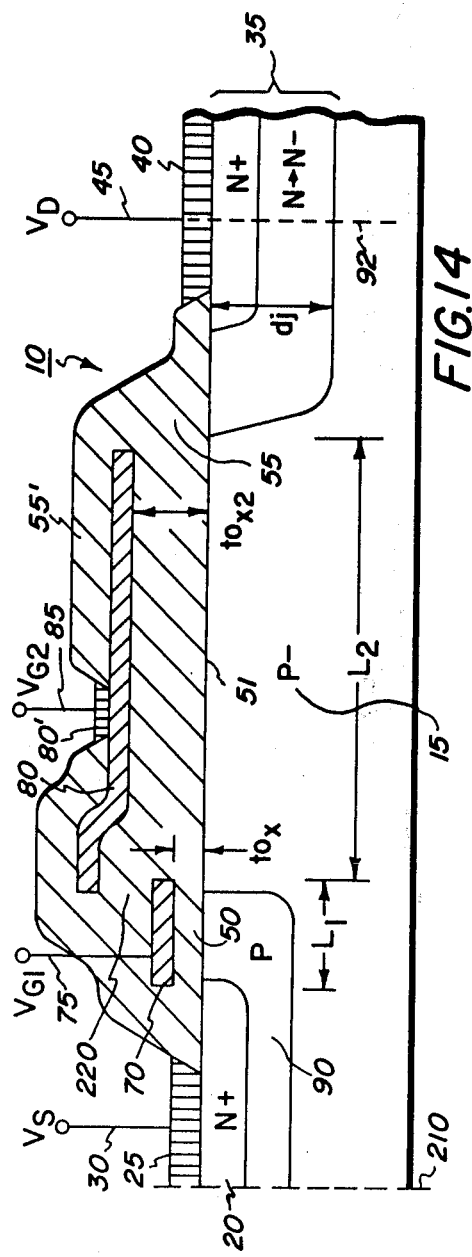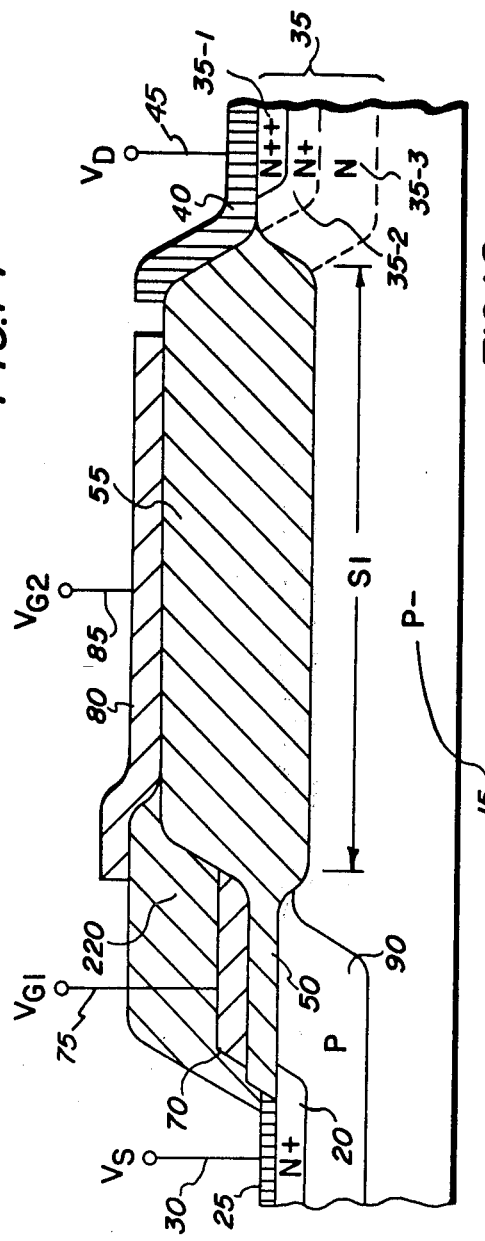

4,288,801

MONOLITHIC HVMOSFET ACTIVE SWITCH ARRAY

CROSS REFERENCE TO A RELATED PATENT APPLICATION

A patent application entitled "High-Voltage DMOS-MOS process" having application Ser. No. 970,679 now abandoned and filed on Dec. 18, 1978 by Keming Yeh and assigned to Xerox Corporation described and claimed an HVMOSFET upon which the present invention is an improvement. The present invention also relates to inventions disclosed in coprending applications U.S. Ser. No. 043,851 filed May 30, 1979, 043,283 filed May 29, 1979, 043,853 filed May 30, 1979, 043,870 filed May 30, 1979, 043,288 filed May 29, 1979, 043,972 filed May 30, 1979, 043,852 filed May 30, 1979 all to the invention RAM RONEN, entitled "High Voltage MOSFET With Inter-Device Isolation Structure," "High Voltage MOSFET With Graded Field Plate," "High Voltage MOSFET System Structure," "HVMOSFET Device With Single Poly Gate Structure," "High Voltage MOSFET With Overlapping Electrode Structure," "High Voltage MOSFET With Doped Ring Structure," "High Voltage MOSFET Without Field Plate Structure," respectively.

BACKGROUND OF THE INVENTION

1. Field of the Invention

This invention relates to the field of semiconductors and more particularly to closed geometry high voltage MOSFET driver arrays that may be switched.

2. Prior Art

Previously, high voltage devices tended to be discrete and could be set up in an array by hardwiring them together on a printed circuit board. Extreme care had to be taken in regards to proper separation of the intra voltage breakdown with respect to the devices, and in addition, measures had to be taken that no fields from the high voltage devices interferred with the low voltage logic in adjacent areas. With the need to integrate such devices additional problem of a device switch for which it is desired to connect in cascade an active load thereto, but unable to due to the fact that with an outer common electrode, the output electrode is effectively grounded.

SUMMARY OF THE INVENTION

It is an important object of the invention to employ integrated monolithic arrays of high voltage metal oxide semiconductor field effect transistors with split oxide having closed device geometry whose periphery is grounded for use as switchable drivers able to source and sink non-steady state pulses; and Yet another important object of the invention is to connect in cascade and concentricity an outer drive switch to an inner active load for formation of an integrated HVMOSFET switch.

BRIEF DESCRIPTION OF THE DRAWINGS

Various other objects, advantages and meritorious features of the invention will become more fully apparent from the following specification, appended claims and accompanying drawing sheets.

The features of a specific embodiment of the invention are illustrated in the drawings in which:

FIG. 14 is a side profile view of a double level poly overlapping discrete electrode structure as an alternative embodiment to the HVMOSFET of FIG. 1;

FIG. 16 is a side profile view of a double level poly overlapping discrete electrode structure without insulation over the field plate as an alternative embodiment to the HVMOSFET of FIG. 14;

DESCRIPTION OF THE PREFERRED EMBODIMENT

Referring to FIGS. 1 through 21 by the characters of reference there is illustrated a high voltage metal oxide semiconductor (HVMOSFET) structure or device 10 for carrying out the object of the invention.

Figure 1:
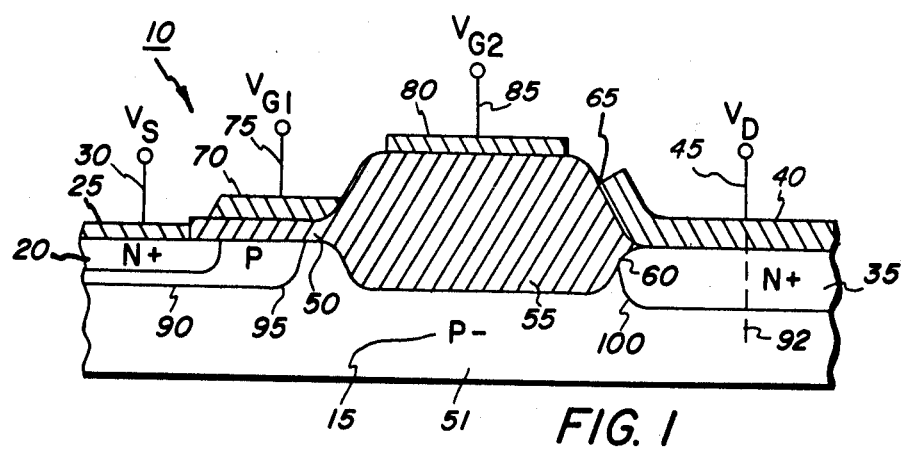
FIG. 1 is a side half profile view of the basic HVMOSFET structure.

With reference to FIG. 1, there is shown the basic HVMOSFET structure 10 in half side profile relative to it's concentricity explained infra for use as a switchable driver which, in turn, is part of a monolithic integrated circuit array with substrate 15. The substrate 15 may be either p− or n−, or NMOS and PMOS technology, but is p− and NMOS in the preferred embodiment. Introduced into the substrate 15 is a source area 20 that is n+ by implantation and is in proximate contact with a source plate 25 of metal on the surface of the substrate 15 which in turn is operatively connected to the source terminal 30 of metal. Also introduced in the substrate 15 is a high-voltage drain area 35 that is n+ by introduction including by implantation or diffusion and is in proximate contact with a drain plate 40 of metal on the surface of the substrate 15 which in turn is operatively connectd to a drain terminal 45 of metal. Oxide as applied is bifurcated or split into separate, but adjacent thicknesses that is, a relatively thin or channel oxide 50, and a relatively thick or field oxide 55. It will be appreciated that the separate channel 90 and drift region 51 constitute a DMOS like structure because the substrate is p−, the channel 90 does not have to surround the source 20. The channel oxide 50 is applied over the surface of the substrate 15 adjacent to the source plate 25 whereas the field oxide 55 is applied into an indention 60, that is, drift region 51 and is relatively adjacent and spatially proximate to the drain plate 40 and to a height relatively above the surface line 65 of the substrate 15. Above the channel oxide 50 and proximate thereto is a first or low voltage control gate 70 of metal or polysilicon (poly) embedded therein for operation as an on-off control element through terminal 75 of metal. It will be appreciated that this first gate 70 may in turn be embedded in oxide for better isolation. A second gate or high voltage field plate 80 of metal or polysilicon (poly) that is proximate to an above the field oxide 55 is operative to receive a voltage through terminal 85 of metal. It will again be appreciated that the field plate 80 may be embedded in oxide for better isolation. The channel 90, which is a p type in the preferred embodiment, is a surface implant, except where the substrate 15 is n− in which case it also surrounds or is buried under the source area 20 thereby moving part of the channel 90 away from the surface as shown in FIG. 1 which acts to control the threshold.

The relatively thin oxide 50 between the control gate 70 and the channel area 90 functions to enhance the gain with good rise/fall time, and lower the on-resistance or impedance (short condition) between source and drain areas 20,35 of the HVMOSFET 10. Correspondingly, in the off (open) condition, high impedance from source area 20 to drain area 35. The relatively thick oxide 55 between the field plate 80 and the drift region 51 allows higher field voltages (VG2) and associated electrical fields as generated by the field plate 80 thereby precluding field inversion for a p-substrate to a greater degree then would be otherwise possible. It will be noted that in this embodiment $V_{G2}=V_D$, but alternatively with other substrates could be VG2 not equal to VD.

Such HVMOSFET's 10 as described supra may be monolithically integrated into exemplary LSI cascaded arrays on a single chip of silicon and are thereby compatible with the fabrication procsses in the MOS technology which they are made. In particular, they may be simultaneously processed with conventional MOSFET's. The resultant HVMOSFET 10 is able to source and sink current pulses up to, and with proper geometry support of high steady state current. It will be appreciated that in such a HVMOSFET 10 driver that is switchable, driving into an impedance (not shown) may require an input from a voltage shifter (not shown) fed by low voltage (LV) logic (not shown) where the HVMOSFET 10, voltage shifter and LV logic may be all on the same chip hence requiring the very good isolation as described supra. It will be further appreciated in view of the above that the voltage shifter will drive the HVMOSFET 10 hard-on thus enabling operation with a relatively high threshold in regards to the HVMOSFET 10.

The N+ source area 20, p channel 90, first gate 70, and field plate 80 constitute rings around an axis of symmetry 92 at the center of the n+ drain area 35 thereby providing a closed device geometry for the HVMOSFET 10. This closed device geometry with rings around a drain area of center 35 that functions as a common axis or axis of symmetry 92 relative to the device 10 may take the form of a circle, square or similar topography constituting complete concentricity or even half circles or squares constituting partial concentricity relative to the LV logic and voltages shifters on the same given chip. The closed geometry provides intraisolation within the HVMOSFET 10 and also inter-isolation on the same chip with respect to other devices. In particular with an n− substrate 15, inter-isolation e.g. (closed geometry) is required. It will be also noted that in regards to isolation, the field plate 85 will surround the drain 35 on at least three sides with possibly a bracketing field oxide for the fourth side as noted infra.

As in most DMOS-like structures, the HVMOSFET 10 has a conventional junction breakdown surface 95 between the p channel 90 and drift region 51 for an n− substrate 15, or as in this embodiment, a junction breakdown surface 100 as between the drift region 51 and the N+ drain area 35 for a p− substrate 15. It will be noted that with an n− substrate 15 in a DMOS like structure for the HVMOSFET 10, VDS falls on the PN− junction surface 95 and thus into the channel 20. In such a case, the VG2 of the field plate 80 would have to be negative to turn the drift area 51 off. In addition, inter-isolation relative to other devices would be required in such a case. Alternatively, in a p− substrate 15, the p−N+ junction or drain junction must be relatively deep which can be compensated for by inter-isolation with respect to the drain area 35.

Figure 2:
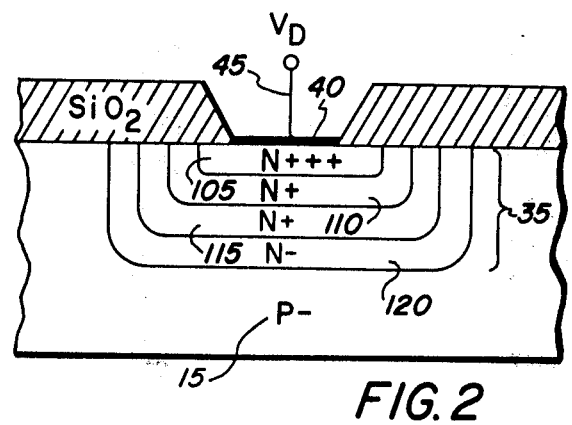
FIG. 2 is a side profile view of a graded junction for the HVMOSFET of FIG. 1.

The breakdown voltage of the drain area 35 can be increased while minimizing the curvature problem both mathematically and physically, which is to say, providing a linear junction rather than an abrupt one. This is carried out by providing contact area that has been heavily doped to maximize current flow under a heavy on condition. In particular, a multiple implant/drive profile is achieved by providing a graded junction at the drain consisting of by way of example, N+++ 105, N+ 100, N115 and n− 120 in the drain area 35 proximate to drift area 51 in the p− substrate 15 as shown in FIG. 2. It will be noted that an incremental or discrete graded junction is shown in FIG. 2, but alternatively, a continuously graded junction of doped material could be used.

Figure 3:
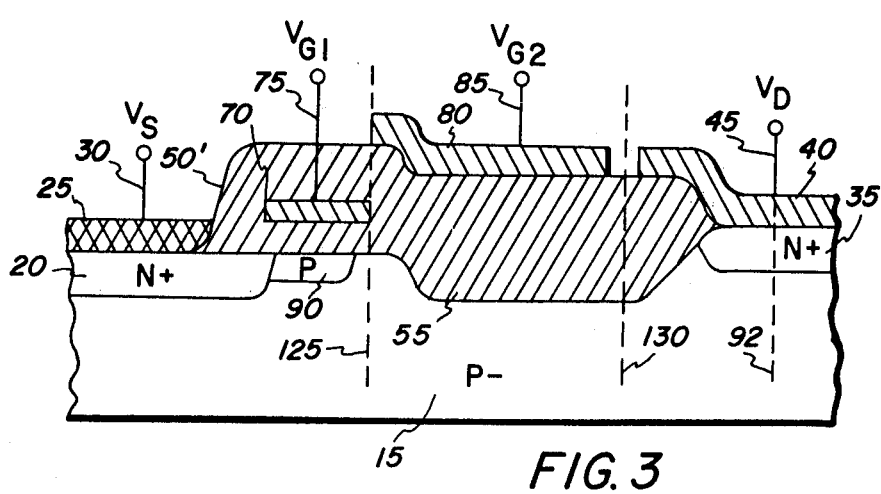
FIG. 3 is a side half profile view of a no-offset structure for the HVMOSFET of FIG. 1.

Referring to FIG. 3, in an alternative embodiment relatively very low on-resistance, as between source drain plates 29, 40 and relatively high speed switching operation as controlled by the first plate 70 may be desired. In some cases a no-offset structure, relative to the horizontal plane, might be utilized as shown in FIG. 3. It will be appreciated that the plates of FIG. 1 were relatively spatially offset. By way of example, thick field oxide 55 is used as above and also to the same level as in the thin channel oxide area 50, thus covering over the first gate 70 and part of the terminal 75 which is embedded therein. As indicated supra, there is no offset relative to the horizontal plane, and in particular as between the first gate 70 and the field plate 80 there is relatively no offset as shown by the dotted vertical line 125. Likewise, as between the field plate 80 and the drain plate 40 there is relatively no offset as shown by dotted vertical line 130.

Figure 4:
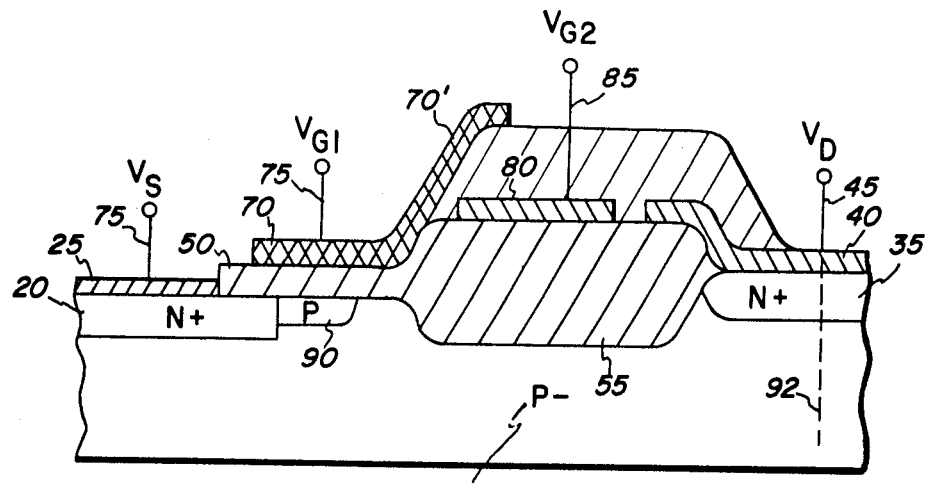
FIG. 4 is a side half profile view of the electrode overlap structure for the HVMOSFET of FIG. 1.

The same result as above may be had as shown in FIG. 4, by overlapping the first gate electrode 70 in area 70' relative to the field plate or electrode 80 where the field plate 80 and part of the drain plate 40, is embedded in the thick field oxide 55. It will be noted in regards to the above that the lack of an electrode or plate overlap as in FIGS. 1 and 3 may result in higher on-resistance as between the source and drain plates 70, 40 which would be an undesirable condition in some application. However, for most applications, the fringing fields from the various gates or plates are strong enough to modulate the surface 65 of the substrate 15 laterally.

Figure 5:
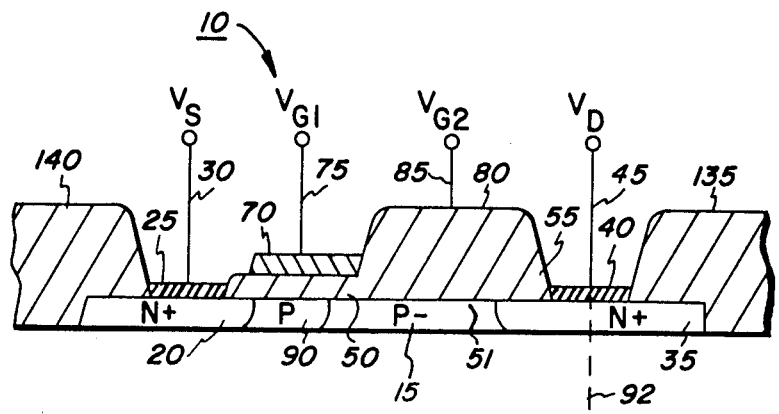
FIG. 5 is a side half profile view of the SOS substrate for the HVMOSFET.

In another alternative embodiment as shown in FIG. 5, sapphire is used for the substrate 15 and the drift region 51 has introduced therein by implantation of p− or n− type material. The sides of the HVMOSFET device 10 bracketed by field oxide (SiO2) for isolation on either side 135, 140. No silicon is present outside the active area. It will be noted that sapphire is a superior albeit expensive inter-device isolator.

Figure 6:
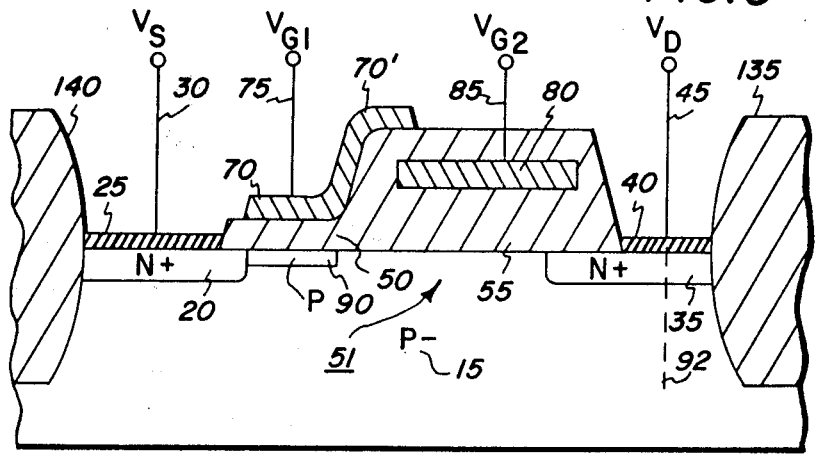
FIG. 6 is a side profile view of the silicon structure for the HVMOSFET of FIG. 1.
Figure 7:
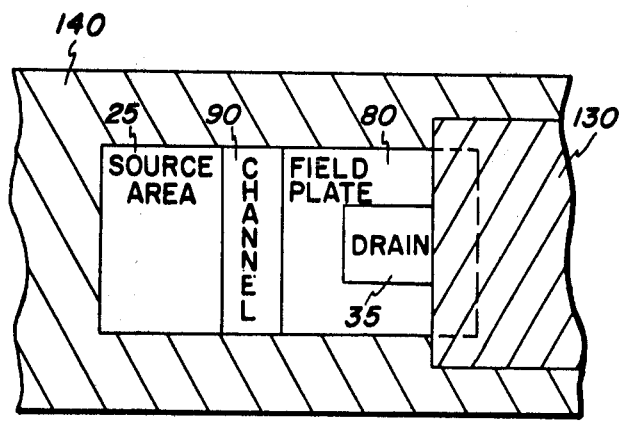
FIG. 7 is an overhead profile slice view of the bulk silicon structure for the HVMOSFET of FIG. 6.

In yet another alternative embodiment as shown in profile in FIG. 6 and in a top view in FIG. 7, a HVMOSFET 10 with a bulk silicon substrate 15 and bracketed by SiO2 sides 135 and 140 for isolation. Bulk silicon is relatively less expensive than sapphire as an isolator, but a degree less effective also.

Figure 8:
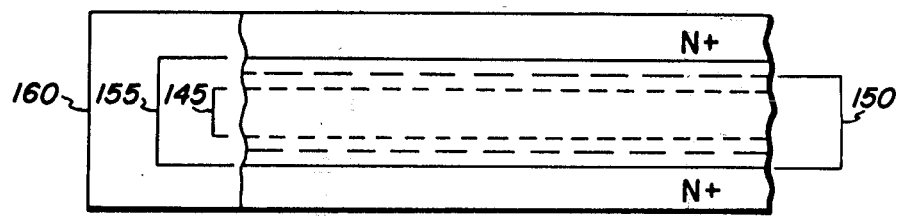
FIG. 8 is an overhead profile view of the isolated conductor structure for the HVMOSFET of FIG. 1.

In closed devices with the drain in the center such as a concentric structure, it is necessary to bring the high voltage lines or leads out from the terminals 30, 45, 75, 85 of the source plates 25, drain plate 40, first gate 70 or field plate 80 respectively without causing breakdown of oxide, excessive field inversion or Miller effects due to excessive capaciture admittance between input and output electrodes. In this embodiment the above problem is solved by routing high-voltage lines out on an oxide residing over a lightly doped area terminated by heavily doped areas on both sides for relatively excellent isolation of the HV lines from the HVMOSFET 10 itself as shown in FIG. 8. As an example (as shown in FIG. 8) a metal drain line 145 from drain terminal 45 is operative to have underneath it SiO2, 150 and underneath that undoped or P or N) implant tailored material 155, and finally on either outer side of that may be bound heavily doped n+ silicon 60.

Figure 9:
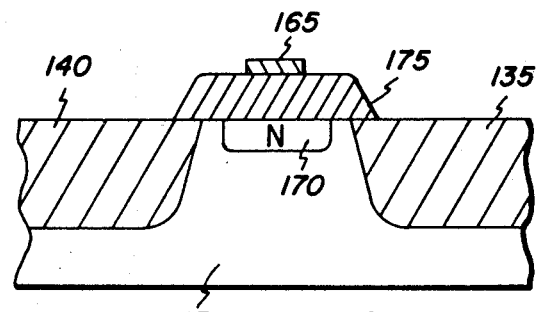
FIG. 9 is a side profile view of the isolated conductor structure for the HVMOSFET of FIG. 1.

In regards to bringing a high voltage line 165 or supra 145 over a lightly doped area 170, such as 155 as mentioned supra, it will be appreciated that it may be necessary to route high voltage lines 165 from the drain plate 40 and field plate 80 between bracketed field oxide 135, 140 or heavily doped silicon 60 mentioned supra and as shown in FIGS. 8 and 9. The field inversion problem or parasetic turn-on generated by the above may create a channel between the field oxides 135, 140, where each acts as a nonassociated diffused bodies in the field when high voltage passes over on the conducting line 165. The above may be alleviated thereby containing HV electric fields and precluding inter-device coupling by raising the conducting line 165 above the substrate 15 on a field oxide bed 175 and in addition, implanting an impurity 170 below the surface of the substrate 15. The lightly implanted area 170 in the embodiment is N, but could alternately b P implanted. With a lightly implanted N area 170, the implant may be completely depleted of carriers trying to accumulate at the surface of substrate 15, thus significantly reducing the conductor, 175, to substrate, 15, parasitic capacitance. Alternatively with a P implant 170 of a value for the N substrate 15 would be chosen to avoid surface inversion while only adding lightly to the capacitance of the line 165. Alternatively, the substrate 15 could be left undoped precluding area 170 to thus minimize capacitance under the line 165 for increasing the depletion region and decreasing the drive capacitance. It will be appreciated that in the preferred embodiment and also in the alternative embodiments, that N and P type implants may be reversed.

Figure 10:
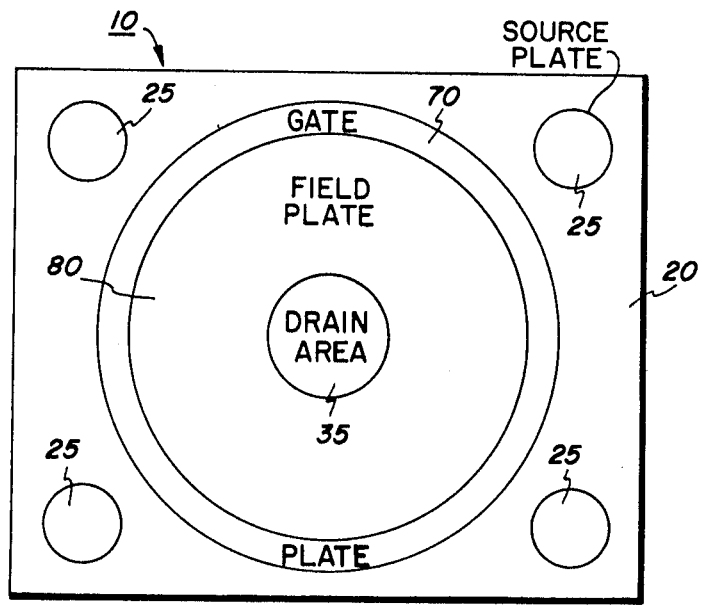
FIG. 10 is an overhead profile view of a concentric grounded periphery configuration for the HVMOSFET of FIG. 1.
Figure 11:
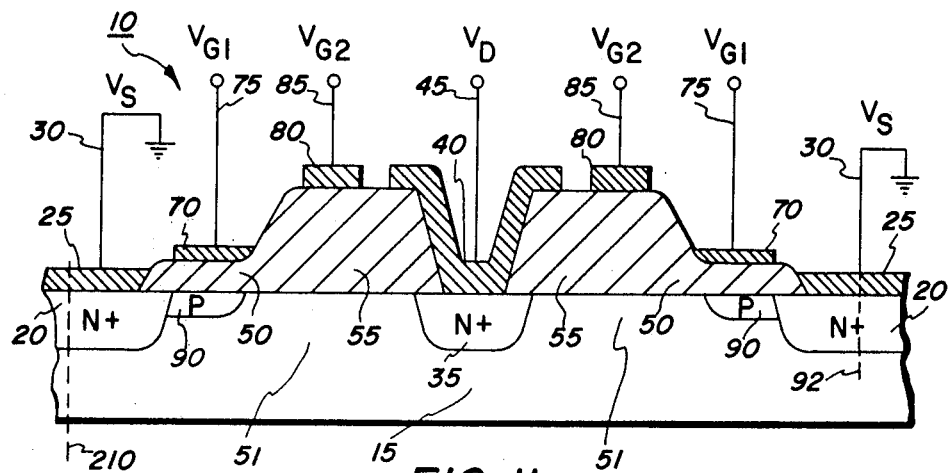
FIG. 11 is a side profile view of the concentric grounded periphery configuration for the HVMOSFET of FIG. 10.

In an alternative embodiment as shown in FIGS. 10 and 11, the HVMOSFET 10 is shown in complete concentricity with the source electrode 30 grounded. This acts to sove the inter-device isolation problem by setting the periphery of the HVMOSFET device 10 at ground as is the substrate 15 thereby allowing neighboring devices to actually touch each other with relative impunity in regards to isolation.

Figure 12:
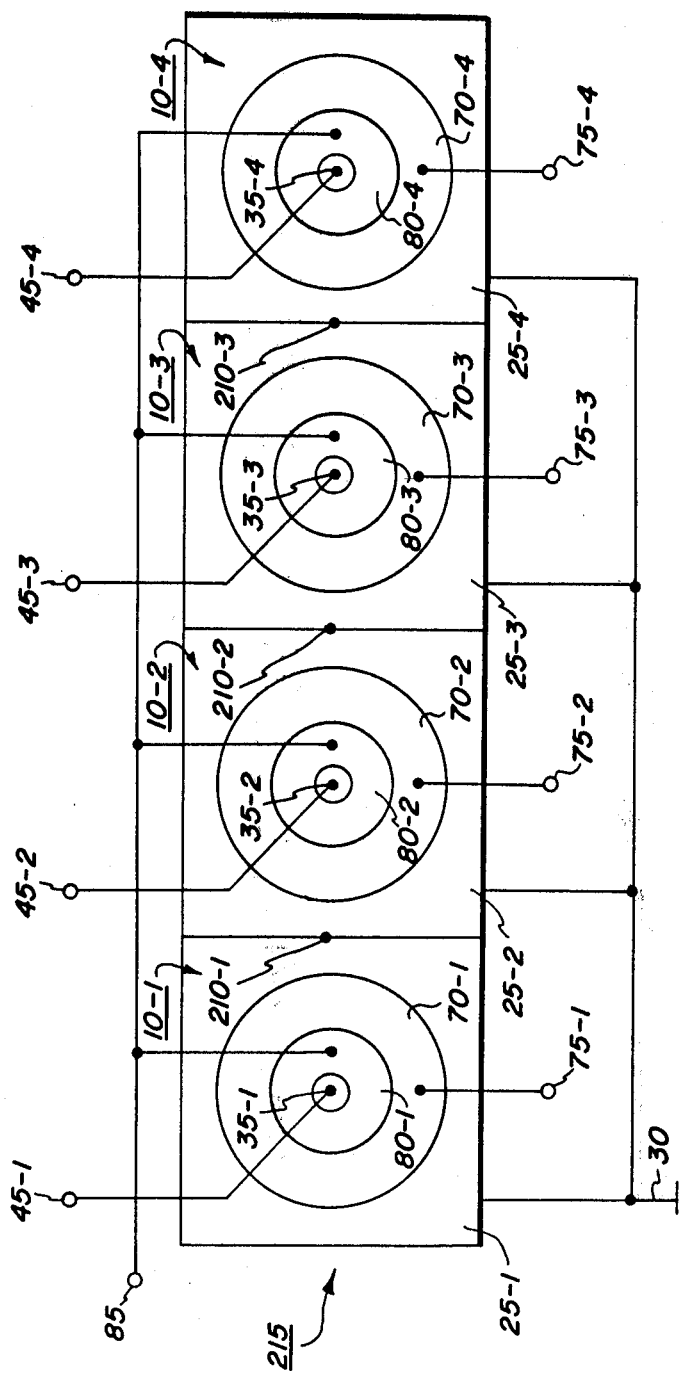
FIG. 12 is an overhead view of an array of HVMOSFET's of FIG. 1.

It will be appreciated that by grounding the source area 25 as described infra and as shown in FIGS. 10 and 11, one can also have an axis of symmetry 210 relative to an array 215 of HVMOSFET devices 10 as shown in FIG. 12 in addition to the axis of symmetry relative to the center of the device mentioned earlier. In particular, as shown in FIG. 12, there is an array of four of the HVMOSFET devices 10-1 through 10-4. The array 215 has a common ground for the source terminals 30 from source areas 25-1 to 25-4, a common HV DC line for the field plate terminals 85 from field plate 80-1 to 80-4, separate LV lines for the central plate terminals 35-1 through 75-4, flow control plates 70-1 to 70-4 and separate HV outputs for the drain terminals 45-1 through 45-4 from drain areas 45-1 to 45-4. As shown there is an axis of symmetry 210-1 through 210-3 relative to the array 215 between each of the HVMOSFET devices 10-through 10-4 of the array 200.

The supra described grounded source area 25 on the periphery of each of the HVMOSFET devices 10 enables the above described symmetrical array 215. Specifically, it reduces fabrication costs by cutting the number of required loads as to the source area 25, increases the number devices 10 per a given area thereby facilitates LSI and even VLSI integration of arrays of such devices on a monolithic chip.

Figure 13:
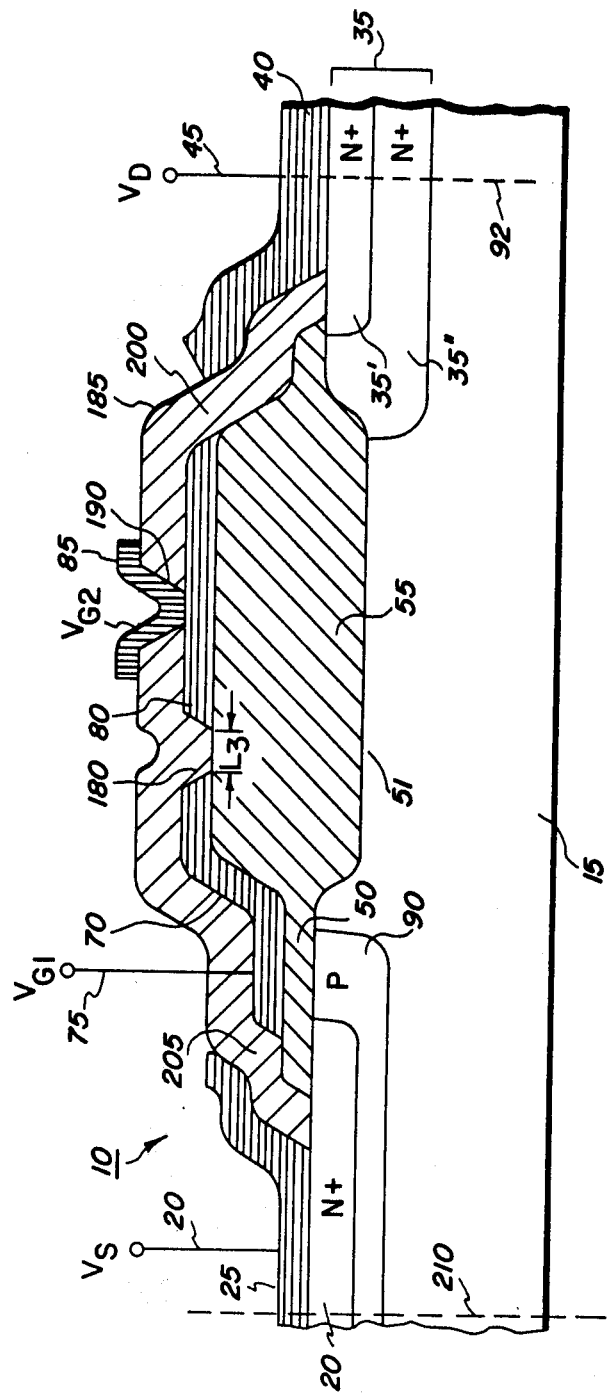
FIG. 13 is a side profile view of a single-poly non-overlapping gate structure as an alternative embodiment to the HVMOSFET of FIG. 1.

In an alternative embodiment as shown in FIG. 13 a single polysilicon layer that is nonoverlapping is used as a modification to the infra described HVMOSFET device 10.

In particular, a substrate 15 with p type is used having a drift region 51 therein, an implanted p type channel 90 an implant graded drain area 35 having a discrete N+ type subarea 35' and N type subarea 35''. In addition, there is a relatively thick layer of field oxide 55 and a relatively thin layer of channel oxide 50 as described supra. Thermel oxide is grown to form the thick oxide 55 over the drift area 51. The channel 90 can be double diffused or defined by photolitograph and ion-implant. The metal or polysilicon (poly) layer for the first o control gate 70 have LV applied voltage potential for turning on-off the HVMOSFET 10 and the second gate or field plate 80 having HV applied for bending field lines away from the drain area 35 may be depsited in a single layering process thereby precluding the expense and time needed for multiple level gates or plates having to be deposited in mult-layers. It weill also be observed that the gates 70 and 80 do not overlap leaving unobstructed the field lines that may flow therebetween, in gap or space 180. Once the polysilicon layer comprised of gates 70 and 80, is deposited another or second layer 185 of oxide for further inter-device field isolation. The source plate 25 deposited as a layer over the N+ source area 20 bounds the second oxide layer on one side, and the drain plate 40 deposited as a layer over N+ drain area 35 bounds the second oxide layer on its opposite side. An aperture 190 allows the electrode 85 deposited as a layer to make external electrical contact to the field plate 80. It will be noted that the voltage potential applied to gate 70 is a LV control potential. It will be further noted that there is overlapping spacing, this is, no overlap between gates 70 and 80, and plate 25, 40. Proper choice of spacs 180,200 and 205 as between the gate and plates 25, 70, 80 and 40 is made so as to preclude field line crowding in the silicon which is to say field drop rate between the plates and gates 25, 50, 70 and 80 is significantly less than the maximum permissible field, particularly in the silicon at the surface of the substrate 15.

Figure 15:
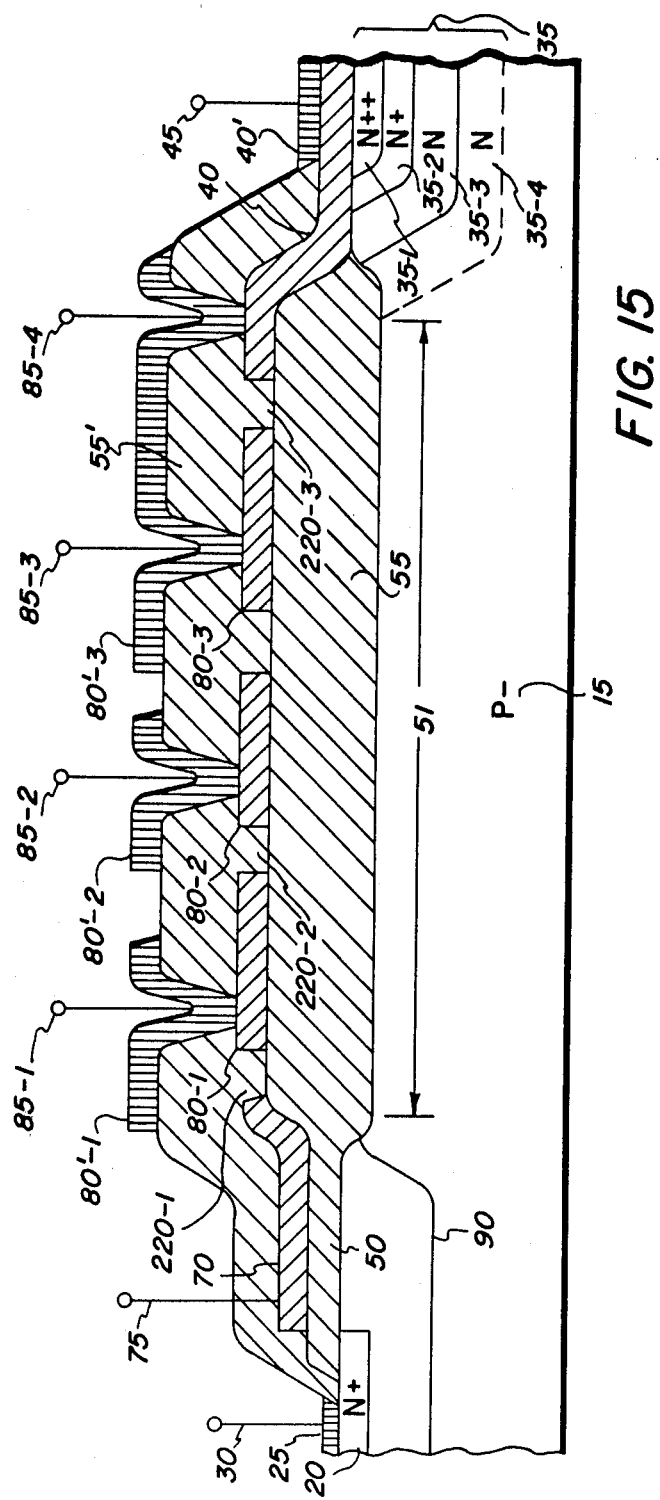
FIG. 15 is a side profile view of a single poly plus metal overlapping multiple electrode structure as an alternative embodiment to the HVMOSFET of FIG. 14.

It will be appreciated that the gates 70 and 80 and in particular gate 80 need not be continuous, but rather may be in discrete multiples as in FIG. 15 where the need arises to tailor the field lines 50 along the substrate oxide boundries as to evenly spread them out and stretch or bend them away from the drain area 35 thereby enabling a higher breakdown voltage thereat. Because there is no DC current into gates 70, 80, and in particular gate 80, they can be connected to a proportional polysilicon voltage divider (not shown) for the discrete divisions mentioned supra, so that the field plate potentials can be optmized. It will be appreciated that the voltage The gap 180 between the two poly films or gates 70 and 80 can be minimized without avalanche setting in or causing a breakdown in the oxide 50 and 55. In addition, the drift field from field plate 80 to drain plate 40 can assure proper injection into space 180 during an on condition for the HYVMOSFET device 10.

It will be appreciated that in the heavily "ON" mode for the HVMOSFET device 10, once the drain voltage applied to plate 40 has dropped enough, the fringe field at spaces 180 and 205 drops thus enabling those areas to actually simulate relatively large resistors or series resistance whose size is subject to the change on the surface of the substrate 15. This series resistance is not detrimental in that if for the capacitance in the spaces 180 and 205, the discharging of an external capacitor C, is completed in a relatively short time and thus is sufficiently low so that Rs times C is less than or equal to T where Rs is series resistance, C is capacitance, and T the time constant for a required discharge time. Once capacitance discharge is complted, RS may rise provided that Von is sufficiently low for the application. As indicated supra, it is necessary to overcome series resistance in the space between the overlapping plates and gates associated with HVMOS devices in an on-mode having large drift regions. Specifically, the HVMOSFET devices 10 having drift regions 51. Insomuch as prior art solutions involve complete processing with possible critical steps, such as relatively very narrow gaps or lightly doped rings, they cause to be economically or technically viable with higher levels of integration and voltage associated therewith.

One proposed solution giving relatively high speed is the infra alternative embodiment is to fabricate HVMOSFET structures 10 with overlapping electrodes, and in particular, overlap the field plate electrode 80 relative to the gate electrode, as shown, in FIG. 14. It will be appreciated that the above solution is equally applicable to devices 10 having discrete field plates 80 and gates 70 as shown in FIG. 14 and 16 or alternatively devices 10 having multiple field plates 80 and gates 70 to further more finely tailor the field lines generated by the plate 80 thereby controlling and thus preventing bunching up of possibly destructive field lines therein the field oxide 55 as shown in FIG. 15.

The above mentioned overlap may be achieved by double layer poly (or polysilicon) or by a polysilicon metal combination depending on the requirements of the technology.

The double level polysilicon overlapping region of the HVMOSFET 10 having discrete field plates 80 and gate electrodes 70 is shown in FIG. 14. In particular, N+ source gate 20 having source plae (Vs) 25 of aluminum metal may be grounded through terminal 30. The P channel 90 is shown as sweeping around the N+ source area 20 may be only a surface implant for a P− substrate 15 as shown. In any case, the surface dimension L1 is 3.0 um for double diffusion and 5.0 um for defined ion implanted. It will be noted that there is an axis of arry 215 symmetry 210 adjacent to the source area 20.

The gate electrode 70 is at a relatively low voltage (LV) control potential in this embodiment as disposed over relatively thin channel oxide 50. The depth of the channel oxide 30 is $tox_1$ 1500A. The gate electrode 70 is polysilicon and is one of the supra mentioned double layers. The field plate electrode 80 embedded inthe relatively thick field plate oxide 55 is dispsed to a depth of $tox_2$ greater than or equal to 1.2 um in the preferred embodiment. The field plate electrode 80 is comprised of polysilicon and is one of the double layers mentioned earlier. Intervening between the field plate electrode 80 and the terminal (VG2) 85 is a metal plate 80' for the binding of each to the other. It will be appreciated that in this embodiment that field oxide 55' has been reflowed over the top of the field plate 80 for greater isolation. As indicated supra, a single or discrete field plate electrode 80 relatively overlaps a single or discrete gate electrode 70, but the total horizontal length of the field plate electrode 80 is L2 or 43 um for breakdown voltage between source area 20 and area 35 of 500 V. It will be appreciated that this length coincides and correlates with the relative large drift area 51 mentioned earlier as between the source and drain area 20, 35. The drain area 35 or high voltage output interfaces with a drain plate 40 of aluminum metal that outputs through terminal (VD) 45. The drain area 35 is a graded implant similar to that mentioned earlier with a N+ subarea 35' nearest the surface and a N− subarea 35" having a combined overall depth of dj that is greater than 5.0 um or up to 10.0 um for a multiple implant to eliminate curvature. As before the device 10" has an axis of symmetry 92 relative to the device 10 itself and an axis of symmetry 210 relative t the other devices 10 in the array 215. The supra overlapping device polysilicon layer where the field plate electrode 10 is the upper layer and the gate eletrode 70 is the lower layer are fabricated to be lad down as separate layers where overlap is at space 220.

In FIG. 15, there is shown a HVMOSFET structure 10 with multiple field plates 80-1 through 80-3 that sequestially overlap each other and the field plate 80-3 overlapping the single gate electrode 70. The multiple field plates 80-1 to 803 and gate electrode 70 are fabricated as a single level of polysilicon plus metal.

In particular, there is shown a N+ source area 20 with associated source plate 25 and terminal 30. In addition, there is a surrounding P channel area 90 with associate channel oxide 50 displaced between the channel 90 and gate electrode 70. The gate electrode 70 being composed of polysilicon and has applied there, relatively LV control potential. In the P− substrate 15 is a relatively large drift area 51 for accommodating a relatively large breakdown voltage as between the source area 20 and drain area 35. As discussed before, the drain area 35 is graded to range from N++ (35-1) to N (35-4) for controlling curvature. Associated with the drain area 25 is drain plate 40 of polysilicon and an interfacing metal plate 40' of metal bonding it to terminal 45. Disposed between the silicon dioxide dielectrics 55 and 55' are the multiple field plate electrode 80-1 through 80-3 of polysilicon.

The spatial overlap as between the multiple polysilicon field plates 80-1 to 80-4 and the single polysilicon gate eletrode 70 is provided by metal plates 80'-1 to 80-3 disposed above the field plates 80-1 to 80-3 and the drain plate 40. This overlap at spaces 220-1 through 220-3 act to control the high voltage field lines thereby minimizing the series resistance incurred in the spaces 220-1 to 220-3 during the on mode for HVMOSFET 10 which in turn allows higher breakdown voltage in a large drift area 51. The metal plates 80'-1 to 80'-4 either all or in part with the exception of the drain plate 40, may provide HV DC to the field plate electrodes 80-1 to 80-3. It will be appreciated that in the above embodiment a single level of polysilicon was used in the fabrication of the field plates 80-1 to 80-3, the gate electrode 70 and the drain plate 40.

In an alternative embodiment for the HVMOSFET structure 10, as shown in FIG. 16, having a single overlapping field plate 80 relative to a single gate electrode 70 with double-level polysilicon, there is an absence of field oxide 55' over the field plate 80 as was shown in FIGS. 14 and 15 as is feasible for a P− substrate 15 where isolation is relatively less of a problem then for a N− substrate thereby obviating the cost required to implement such an oxide.

Figure 17:
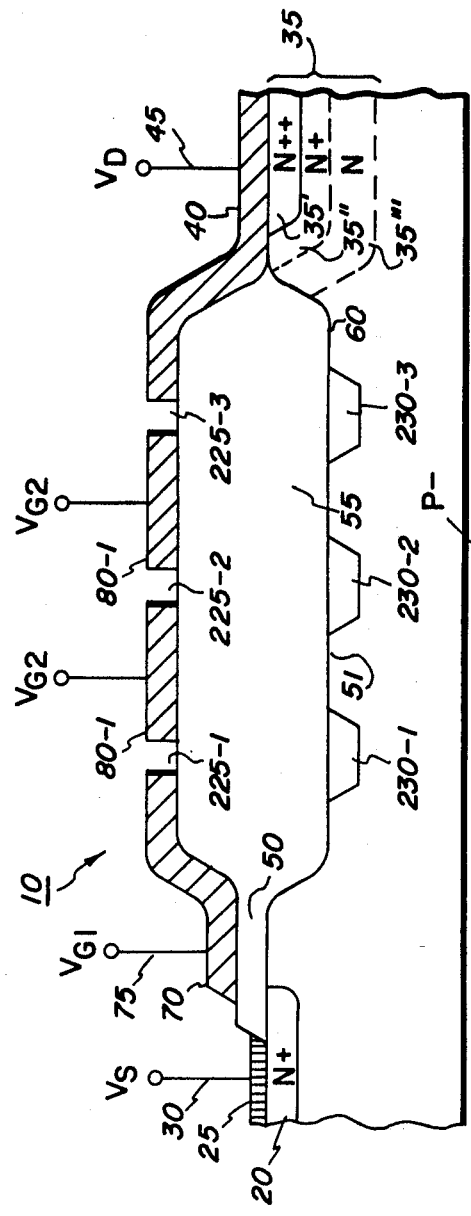
FIG. 17 is a side profile view of a HVMOSFET structure having doped rings for reducing services resistance as an alternative embodiment to the HVMOSFET of FIG. 1.
Figure 18:
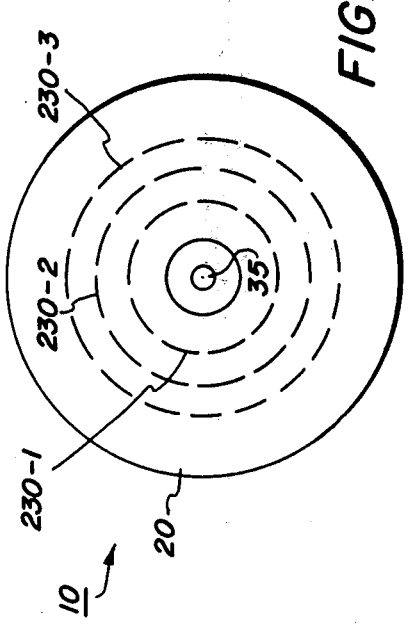
FIG. 18 is an overhead profile view of the HVMOSFET structure having doped rings as shown in FIG. 17.

In regards to HVMOSFET structure 10 with gaps (225-1 through 225-3) between surface electrodes (70, 80-1, 80-2, 40) as shown in FIG. 17, potential problems include overcoming fringing fields and series resistance. One possible remedy for the above includes doping the areas (230-1 to 230-3) between the field plates (801 to 80-2) gates and drain electrode (40) all of these being topographically rings or ring like in closed geometry as shown in overhead profile in FIG. 18.

The HVMOSFET device 10 analogous to those described supra in regards to it's remaining elements includes an implanted N+ source area 20 in a P− substrate 15 having a source plate 25 disposed above for connection to terminal 30. Likewise, an implanted drain area 35 having N++ 526 area 35', N+ 526 area 35' and N subarea 35" disposed below a drain plate 40 connected to a terminal 45. The split oxide in device 10 comprises relatively thin channel oxide 50 and relatively thick field oxide 55 both of silicon dioxide functions as a dielectric. The field oxide 50 being disposed in an indentation over a drift area 51 in the substrate 15 wherein the doped ring areas 230-1 to 3 are implanted. The gate 70 having a relatively low voltage control potential is disposed over the channel oxide. The multiple or discrete field plates 80-1 to 2 with terminals 85-1 to 2 which could be alternatively continued while less field tailoring is required, and disposed over the field oxide 55. Gap 225-3 is interposed between drain plate 40 and field plate 80-1,, gap 225-2 is interposed between field plates 80-1 and 80-2, and gate 225-3 is interposed between field plate 80-1 and gate electrode 70. It will be appreciated that there is correspondence between gap 225-1 and ring area 230-1, gap 225-2 and ring area 230-2, and gap 225-3 and ring area 230-3 respectively. The field plates 80-1 to 2 and gate 70 being single layer polysilicon.

Doping for the ring areas 230-1 through 230-3 includes N- doping to a relatively light degree so that when the drain area 40 field line collapses, the surface 65 of the substrate 15 is easily accumulated due to potential at surface 65 such that when the device 10 is off, the drain 40 and gate 70 fringe field lines totally deplete these ring areas or regions 230-1 through 230-3. Alternatively, P or P+ region or view, areas 230-1 to 3 may be used. In particular, in the "off" mode for the device 10, they will float to the appropriate potential at the surface 65. In the on mode, the areas 230-1 to 3 will supply electrons thereby emulating a conductivity, but on the other hand not coupling through to gate 70.

In the above embodiment where the field plates 85-1 to 2 are separated from the drain plate 40, $V_{G2}$ greater than $V_D$ by at least one threshold for improvement of off and on modes for the HVMOSFET 10. It will be appreciated that by definition the field plates 85-1 to 2 and gate 70 are non overlapping in this embodiment, and the gaps or spaces 225-1 to 3 from whence field lines flow through are disposed and correlate with the aforementioned ring areas 230-1 to 3 that are implanted in the drift area 51 of the substrate 15 to reduce on series resistance as between the field plates 85-1 to 2 and gate 70 by supplying an easy path to electrodes between the above points.

When the HVMOSFET device 10 is heavily ON and $V_D$ approaches zero by maintaining $V_{G2}$ greater than $V_D$, the ring areas 230-1 to 3 when implanted to n N+ regions, will supply the needed electrons for continuity of the gated regions or spaces 25-1 to 3. It will be noted that the choice of concentration in the varied implants, constituting the ring areas 230-1 to 3, depends on the series resistance and overlap capacitance restrictions of the gates 225-1 to 3. In an alternative embodiment, to avoid coupling between field plates 80-1 to 3 and ring areas 230-1 to 3 doped as N+, the same areas 230-1 to 3 may be doped N type or if buried effects are not a problem then P+ type.

It will be appreciated that the gaps 225-1 to 3 will have to be relatively large to accommodate field lines and to prevent field avalance due to crowding. As an alternative to using N type in the ring areas 230-1 to 3, N- or P type may be used in place thereof, thereby obviating, by way of example, the possibility of ring areas 230-1 short circuiting to the area 35 at the beginning of on mode for device 10 where corresponding gap 225-1 may also attempt to short circuit.

Figure 19:
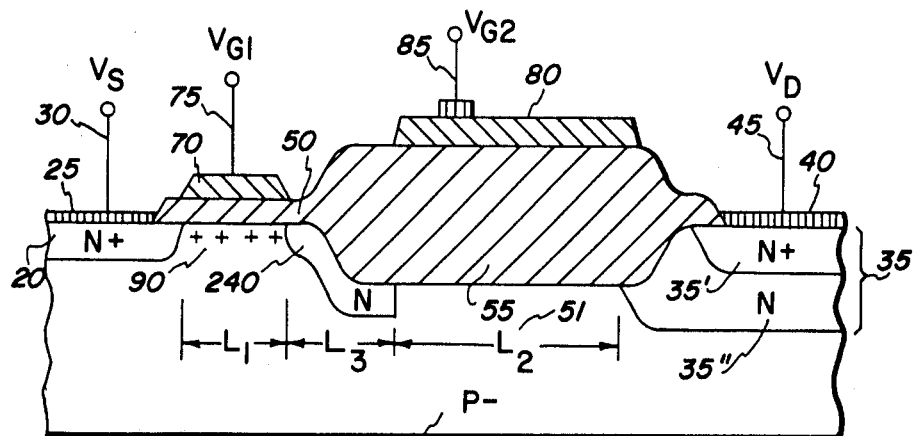
FIG. 19 is a side profile view of a HVMOSFET structure having a doped region between gates as an alternative to the HVMOSFET of FIG. 17.

In an alternative embodiment to eliminate the series resistance in the gap 235, having horizontal dimension L3, due to insufficient drift field, the HVMOSFET device 10 as shown in FIG. 19 may be used. The HVMOSFET 10 similar to supra devices includes implanted N+ source area 20 disposed under plate 25 bonded to terminal 30 for $V_s$. Likewise implanted drain area 35 having N+ subarea 35' and N subarea 35" is disposed under drain plate 40 bonded to terminal 15 for $V_D$. The split oxide of silicon dioxide has channel oxide 50 and field oxide 55 where oxide 55 is disposed over drift area 51 in P- substrate 15 having lateral dimension (L2). An ion implanted channel regional 90 has a lateral dimension (L1). It will be appreciated that the implant for region 90 may be a blank implant after field oxide 55 is in place. Field plate or gate 80 having terminal 85 for $V_{G2}$ is disposed over oxide 55 and gate 70 having terminal 75 for $V_{G1}$ is disposed over oxide 50 where together they are fabricated as a single level of polysilicon.

A doped N type region or island between the two gates 70 and 80, having lateral dimension L3, is relatively highly doped with phosphorous or boron, acts as a source of electrons during the on condition for device 10 to reduce series resistance ($R_s$) significantly. It will be appreciated that the amount of N doping at island 240 must be controlled to limit the level that the voltage at the N island 240 drifts during an off mode thereby preventing the voltage from approaching $V_{G2}$.

Figure 20:
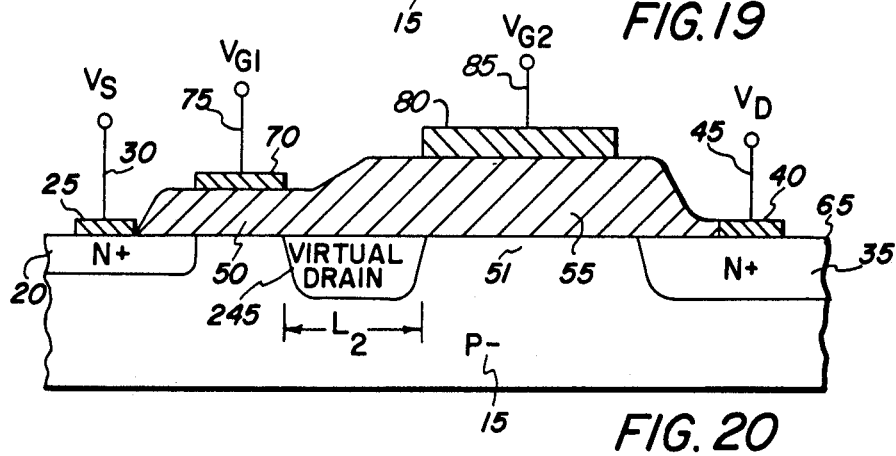
FIG. 20 is a side profile view of a HVMOSFET structure having a virtual drain structure as an alternative to the HVMOSFET of FIG. 17.

In an alternative embodiment, a virtual drain structure with predetermined doping type and carier concentration for HVMOSFET 10 may be used as shown in FIG. 20. The HVMOSFET 10 comprises a structure similar to those given above including an implanted N+ drain area 35 in P type substrate 15 disposed under plate 40 having terminal 45 for $V_D$. Likewise, implanted N+ type area is disposed under plate 25 connected to terminal 30. Field plate 80 of polysilicon having terminal 85 for $V_{G2}$ is disposed over silicon dioxide that is relatively thick field oxide 55. In turn, the field oxide 55 is disposed over a drift region 51. Gate electrode 70 of polysilicon having terminal 75 for $V_{G1}$ is disposed over 5:02 that is relatively thin channel oxide 50. The polysilicon being fabricated as a single layer. The new element in this alternative embodiment being a virtual drain 245 that may be N+ with heavy phosphorous giving an analogous cascade structure. Specifically, while the device 10 is in the on mode, the virtual device 215 helps injection of electrons in the drift region 51 which is inverted. In contradistinction, when the device 10 is in an off mode, the virtual drain 245 will float to within one threshold voltage of the second gate or field plate 80, i.e. $V_{G2}$-$V_{T2}$. This will cause a small voltage to drop across L2, the lateral spatial dimension for virtual drain 245, instead of the entire voltage. Accordingly, if the doping of the virtual drain 245 using P type is not strictly controlled, the HV aspects of the device 10 will be obviated thereby causing it to simulate a LV cascade structure. With this in mind, alternative embodiments that would require less process control than that described supra include making the virtual drain P dope. Thus in the device 10 off mode, the virtual drain 245 would not float to $V_{G2}$-$V_{T2}$ as would to as described before if not strictly controlled and in an on mode the virtual drain 245 would emulate a conductor better than when completely undoped. Alternative, once could obviate the virtual drain 245 completely and rely strictly on the drift field. Alternatively, one could dope the virtual drain 245 relatively lightly to be N type, so as to be almost intrinsic, so that under sufficient voltage on $V_{G2}$ the virtual drain 245 would deplete during the off mode for device 10. Alternatively, one could bury a channel (not shown) relatively light in N type relatively deep in the substrate 15. This would function especially well when $V_D$ equals $V_{G2}$ because when $V_{G2}$ collapses, the surface 65 of the substrate 15 will not be depleted and thereby conduct relatively heavily.

It will be noted that when the goal is to reduce series resistance in a HVMOSFET 10 other possible alternative embodiments include doped ring areas 230-1 to 3 that ar off-set as to each other, but electrically connected (not shown), multiple ring areas 230-1 to 3 each with independent field voltages (not shown), tailored doped rings 230-1 to 3 to get a uniform field drop in the lateral direction, that is from drain area 35 to source area 0. It will be noted that by tailoring the potential profile of the surface 65 from drain area 35 to source area 20, no crowding of field lines will occur. In addition, it will be particularly noted that no high fields will appear across the field oxide 55 thereby preventing electron injection, oxide charging and instabilities.

Figure 21:
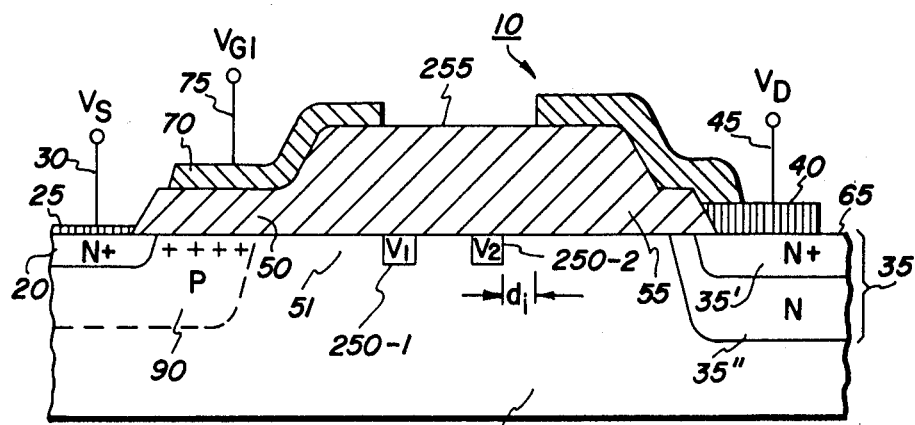
FIG. 21 is a side profile view of a HVMOSFET structure having doped rings for preventing a field line crowding as a alternative embodiment to the HVMOSFET of FIG. 1.

In the HVMOSFET structure 10 where the need is critical to spread out the field-lines, relative to the drain area 35 so that field crowding does not occur, and in addition, adjust field potential lines so that they are perpendicular to the dielectric or field oxide 55, then the use of field plates 80 may be suboptimal in such an environment. As an alternative, as shown in FIG. 21, the use of doped ring 250-182 around the drain area 35 along the surface of the substrate 15 can stretch out the field lines while at the same time not adding significantly to the series resistance in the on mode of the device 10. According to a HVMOSFET structure 10 as shown in FIG. 21 may be implemented to include such rings 250-1 and 2 comprising a N+ source area 20 implanted in the substrate 15 with a source plate disposed over the area 20 and is externally electrically connected through terminal 30 having $V_S$, Likewise, N+ drain area 35 is implanted in substrate 15 with a drain plate 80 disposed on the area 35 and is externally electrically connected through terminal 45 having $V_D$. The drain area 35 is graded into subareas with N+ 35′ through N35″. The split will be noted that $V_1$ is the potential or doped ring 250-1 and $V_2$ is the potential or doped ring 250-2. field oxide has relatively thin channel oxide 50 of silicon dioxide of dielectric disposed over an implanted p channel area 90 that surrounds N+ source area 20. Disposed over the channel oxide 50 is relatively low voltage potential control gate electrode 70 embedded in the surface thereof for turning onoff the HVMOSFET 10. In addition, a relatively thick field oxide 55 of silicondioxide as a dielectric disposed over a drift area 51 in the substrate 15. Disposed partially over the field oxide 55 is a continuation of the drain plate 40. The doped rings 250-1 and 2 are implanted in the surface 65 of the substrate 15 in the region of the drift area 51 and are relatively offset as to each other and also as to the gate electrode 70 and the drain plate 40. As indicated supra, the use of field plates 80 has been obiated in this embodiment by the use of the doped rings 250-1 and 2. Thereby leaving a gap 255 on the surface of the field oxide 55 as between the gate electrode 70 and drain plate 40.

It will be appreciated that carrier concentration in the rings doped on the substrate 15, the desired field profile and the field oxide 50. In particular the desired field profile, in turn, is dependent on drain voltage $V_D$ on terminal 15, spacing of the deposed rings 250-1 and 2, and the relative doping of the rings 250-1 and 2. To be effective, the rings 250-1 and 2 should be accumulated when the device 10 is conducting in the on mode and totally depleted when the drift region 51 has to support the high drain ($V_D$) to source ($V_S$) voltage in the off mode. Accordingly, to prevent surface breakdown of junctions as in the source and drain areas 20 and 35, multiple rings 250-1 and 2 of doped silicon under the surfaces may be used to keep the field lines from bending in towards the junctions or other perimeter of the source and drain areas 20, 35.

In the application of doped rings 250-1 and 2 to HVMOSFET structures 10, certain conditions must be met. In particular, the rings 250-1 and 2 must be doped below degeneracy. In the off mode, the structure 10 will support relatively high voltage. In the on mode of the device 10, the rings 250-1 and 2, which are floating at ($V_S$ greater than $V_1$ greater than $V_2$ greater than $V_D$), will start to drop in potential. However, as long as their potential is higher than the neighboring or adjacent surface 65 of the substrate 15, injection and collection will take place. It In the above embodiment of using doped rings 250-1 and 2 in place of field plates 80, the doped rings 250-1 and 2 cannot be placed proximate to or under any plate such as the drain plate 40 at a higher potential from the floating potential required to sustain an overall HV breakdown. If this condition is violated, the doped rings 250-1 and 2 float to within a threshold voltage (VTH) of the corresponding field plate the potential or drain plate potential 40. The horizontal spacing or gap (d1) between the doped ring 250-2 and the corresponding plate such as drain plate 40, has to be greater than the coupling distance.

The doping in rings 250-1 and 2 is chosen for optional shaping for the field lines which is to say as indicated supra, to prevent field crowding and allow perpendicular adjustment relative to the dielectric oxide 50. The rings 250-1 and 250-2 may be doped N- and P-, or even N and P, when compensated, resulting in a net doping needed for HV breakdown.

While a particular embodiment of the present invention has been described and illustrated, it will be apparent to those skilled in the art that changes and modifications may be made there in without departure from the spirit and scope of the invention as claimed.

Figure 23:
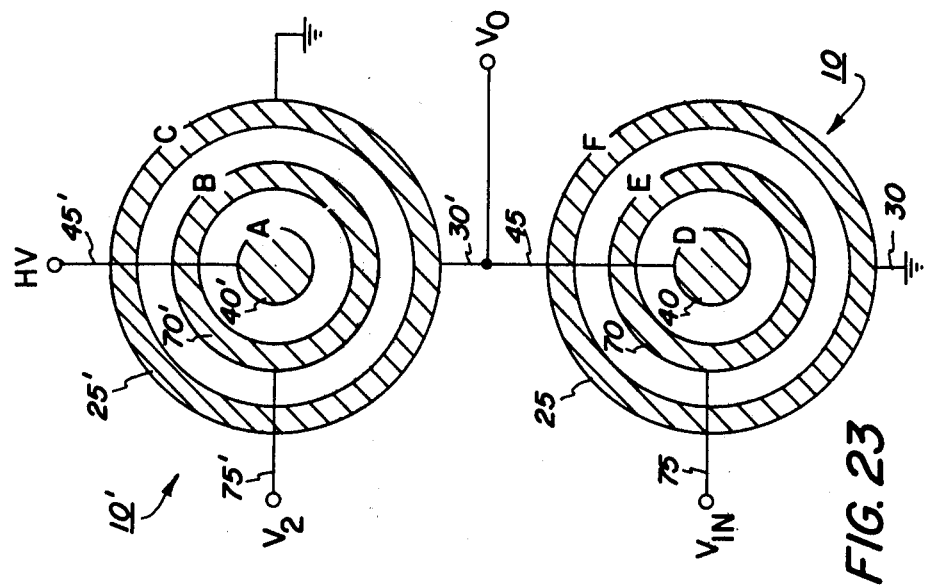
FIG. 23 is an overhead view of a prior said device to accomplish the symmetric view of FIG. 22.
Figure 22:
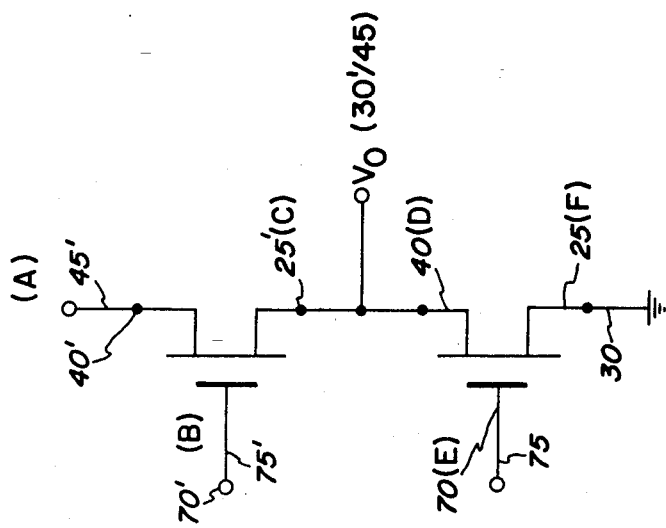
FIG. 22 is a view of a HVMOSFET driver connected in cascade to a HVMOSFET load a schematic embodiment to the HVMOSFET of FIG. 1.

In an alternative embodiment for an array, there is a need to monolithically integrate the HV driver 10 and associated active load 10′ to be connected in a cascade mode to form a complete high voltage switch 10/10′. In the prior art, the problem has been how to connect the HV driver 10, that is a transistor, with an active load 10′, that is a tansistor, when they are both on the same substrate, and have one electrode common with the substrate, e.g. common source. Independently in a conventional HVMOSFET 10, as shown in overhead profile in FIG. 10 and in side profile in FIG. 1, the high voltage electrode or drain area 35 is in the center and the surrounding grounded electrode or source 30 is common to the substrate 15 with control gate 70 and field plate 80 intermediate thereto. When such devices 10 are in an array, cascading such devices as driver 10 and load 10′, together as shown in overhead view FIG. 23 and schematically in FIG. 22 does not form a HV switch. Connecting the HV devices 10 in cascade, where there is a common source 30 or drain 45, results in a common output unless the load transistor 10′ is independently isolated from the substrate 15. Rather what happens is that the output electrode, Vo (30′/45), is connected to the source area 25′ in the load device 10′ which is a common electrode. Hence, it cannot rise above such source voltage (Vs) and the fact remains essentially at ground potential. As it happens, the same problem is true for a cascade connection of any two devices the high (drain) or low (source) voltage electrodes that are in common with the substrate 15 in common with the substrate 1t. It will be appreciated that VG1 on line 75 is the input voltage whereas $V_2$ on line 75 may be connected to its drain, source or control device for active control push-pull.

Figure 24:
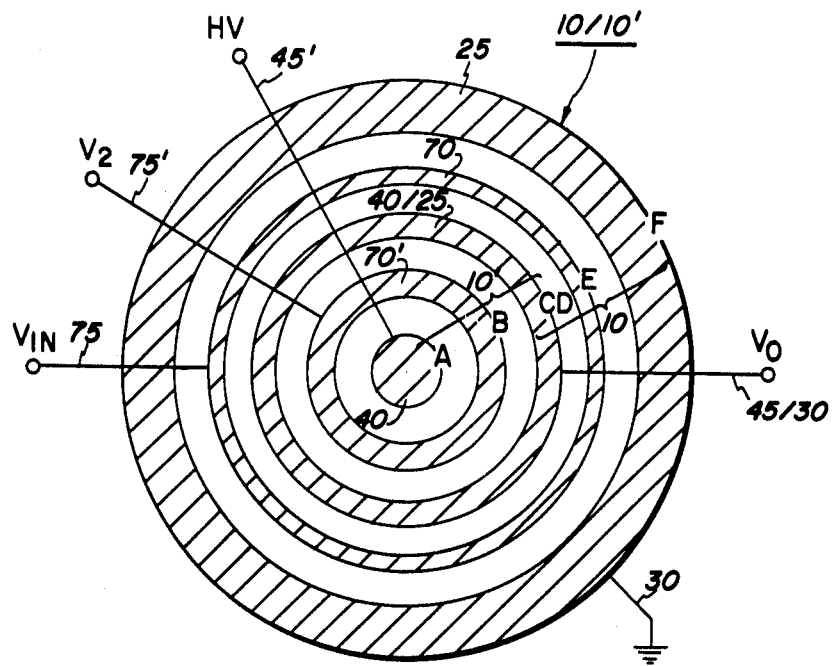
FIG. 24 is an overhead view of an inventive device to accomplish the schematic view of FIG. 22.
Figure 26:
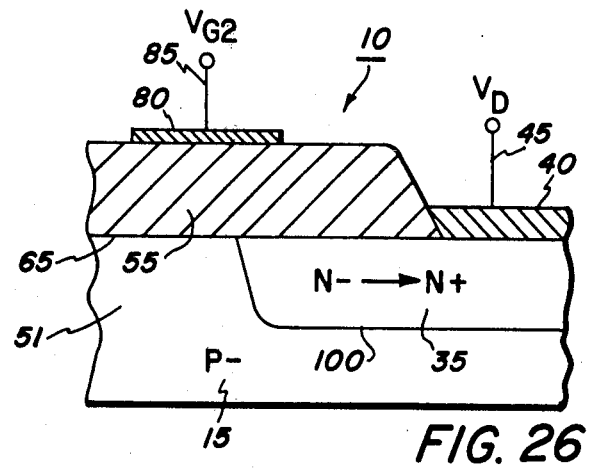
FIG. 26 is a profile view of a HVMOSFET having a junction field plate as an alternative embodiment of the HVMOSFET device FIG. 25.

To overcome this problem, the HVMOSFET structures in FIG. 24 is shown. In order to form an integrated high-voltage switch, two high-voltage devices 10 and 10′ are configured concentric to one another. Hence the fixed potential high voltage electrode is in the center 40′, and the fixed-potential common (to substrate 15) electrode 25 is on the outside. In between are all other electrodes including the control gate electrode ($V_2$) 70′, the output electrode ($V_o$), 40/25′, and the input electrode (Vin) 70, in a monotonical decreasing voltage order from the center 40′ out. Specifically, this is shown in FIG. 26 using the letters A through F. While the driver device 10 (F-E-D) can be a HVMOS of the type disclosed supra, the load device 10' (A-B-C) can be the same device or another HVMOS with different characteristics, that is, lower gain, higher-impedance, or higher-voltage breakdown between gate and source.

It will also be noted that the concentric device 10/10' as shown in FIG. 26 is ccular, but need not be. In fact, it may alternatively be oval/elliptical to increase gain and decrease resistance. Although this device 10/10' is larger than a simple HVMOSFET driver device 10 as described supra, it is integratable, and forms a complete high-voltage switch 10/10'. Moreover, it may be used with an active load 10' on line (V$_2$) 75 such as an electrographic printer, or an ink-jet driver.

It will be further appreciated that the device 10/10' may have relatively thick oxide 55 deposited on and above it both as to the driver device 10 and load device 10' without any field plates 80, or alternatively, only thick oxide 55 on the load device 10' without field plate 80 and split oxide 50/55 described supra on the driver device 10.

Figure 25:
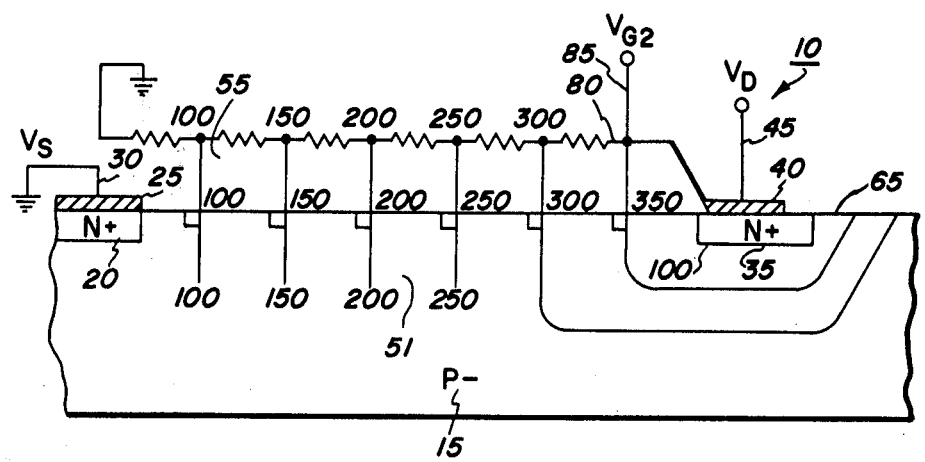
FIG. 25 is a schematic profile view of a HVMOSFET having a graded field plate as an alternative embodiment to the HVMOSFET device of FIG. 1.

In an alternative embodiment as shown in FIG. 25, by grading the applied field plate 80 and tailoring it to match the field lines due to HV at the junction 100 of the drain area 35, one can extend breakdown voltage as between the source and drain areas 20, 35, minimize BV across the thick or field oxide 55 thereby enabling a self-contained HV device. In particular, the field plate 80 when connected to drain area 40 may be incrementally graded from V$_0$ to ground.

Among the subembodiments thereof as shown in FIG. 26, includes placing a field plate 80 over the junction 100 to deplete the material of the substrate 15 and bend the field lines away from the drain at the surface 65 and the junction 100. In such a case, the chosen field plate voltage (V$_{G2}$) on terminal 85 may be greater than the drain voltage (V$_D$) on terminal 45.

Figure 27:
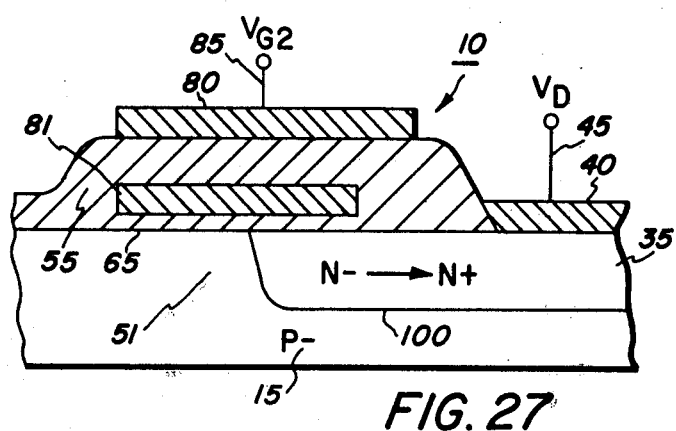
FIG. 27 is a profile view of a HVMOSFET having horizontal floating field plate as an alternative embodiment of the HVMOSFET device of FIG. 1.

In another subembodiment thereof as shown in FIG. 27, an additional floating field plate 81 that is horizontally linear, is interdisposed between the field plate 80 and the surface 65 so that hot carriers can be injected into it by the field plate 80 and thereby minimize the field thereabout in the oxide 55. The floating field plate 81 should either be of polysilicon (poly) or a proper refractive metal such as tungsten or molybedenum.

Figure 28:
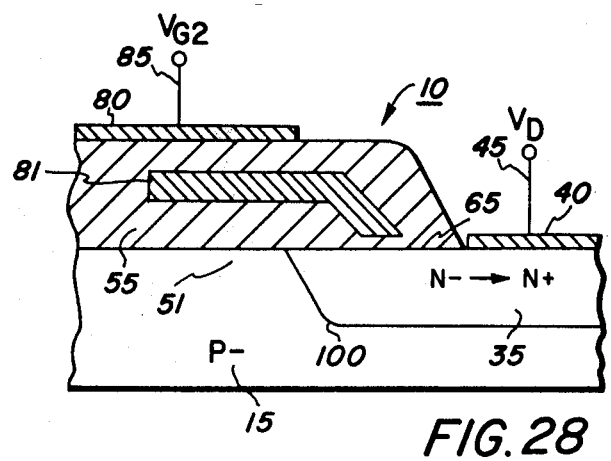
FIG. 28 is a profile view of a HVMOSFET as an alternative embodiment of the HVMOSFET device of FIG. 27.

In yet another subembodiment thereof as shown in FIG. 28, the floating field plate 81 may be a horizontal line in combination with a stepped or ramped linear in configuration thereby allowing tunneling to occur at the drain area 35 and not over the junction 100 or the drift region 51. As the floating field plate gets further from the drain area 35, the oxide 55 underneath has to support a relatively higher field in the off condition for the device 10.

Figure 29:
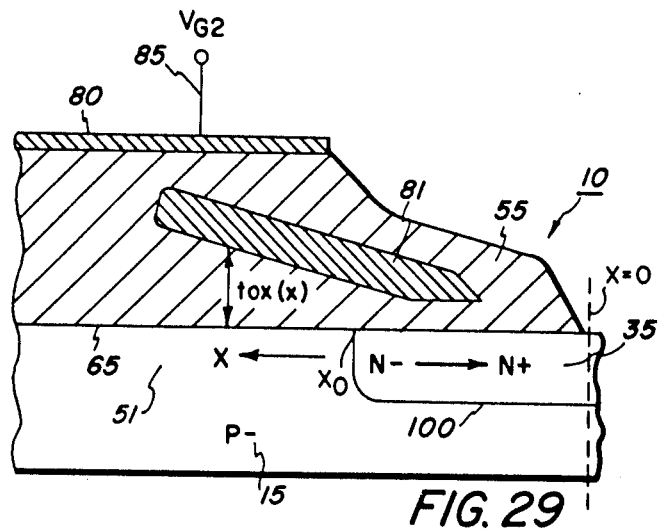
FIG. 29 is a profile view of a HVMOSFT having a ramp floating field plate as an actual embodiment for the HVMOSFET device of FIG. 25.

In yet a further subembodiment thereof as shown in FIG. 29, a pure ramp linear configured according to tox (X) in proportion to (X-X$_O$), that is, operative to prevent destructive oxide breakdown.

Figure 30:
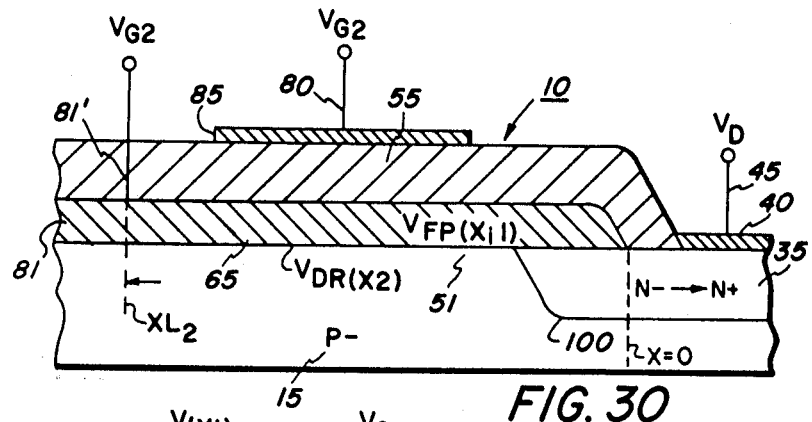
FIG. 30 is a profile view of a HVMOSFET having a smi-dielectric field plate as an alternative embodiment of the HVMOSFET device of FIG. 25.
Figure 31:
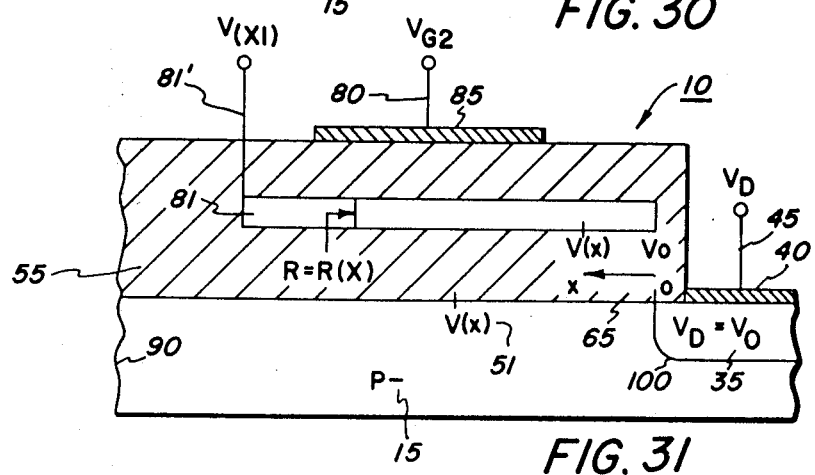
FIG. 31 is a representative model of a HVMOSFET having oxygen doped polysilicon graded field HVMOSFET structure of FIG. 25.

In another further subembodiment thereof as shown in FIG. 30, to prevent hot electrons from becoming a reliability problem, a slightly conductive layer, such as a floating field plate 81, can replace the oxide 55 using SiO2 or Si3N4 over the junction 100 and drift region 51. The plate 81 may be a semiinsulating polysilicon SiP$\phi$S such as oxygen doped polysilicon. The oxygen doped poly for the plate 81 can be put in direct contact with the surface 65 of the p-silicon substrate 15 or alternatively over a relatively thin oxide (not shown). Because of the plates 81 finite through relatively low conductivity, it may act as a very high resistance field plate 81 thereby avoiding the problem of hot electron injection and trapping in the oxide 55 near the drain area 35 as mentioned supra. At the same time, the plates 81 relatively low cnductivity can allow getting up a field at the surface 65 that is relatively almost perpendicular at the surface 65. As shown in FIG. 31, to assure a slow field drop and relatively perpendicular field lines at the surface 65 (equipotentials), an electrode 81' is connected to the semi-insulator plate 81 at X equals XL2 and the voltage at that point VGL is set up so that VFP (Xi) is greater than or equal to VDR (Xi).

It will be noted that by combining a relatively highly resistive plate 81 over the junction 100 and drift region 51, one can reduce tangential field components at the surface 65. Specifically, one can minimize lines that cause crowding at the surface 65. In addition, combination of oxygen doped polysilicon or similar very high resistance material at plate 81 and a geometry factor/shape that makes the lateral field drop from the drain area 35 to the channel (90) equal to the resistance drop in the SiP$\phi$S plate 81. Assuming a depletion region voltage drop of E(X) equals E(O)9NaX/ESi, where Na and ESi are constants for a given substrate 15 type, and the potential distribution is (X) equals VO(1-X/X)$^2$ where XO=X($\phi$=O). It will be noted that by making R(X) proportional to VX$^2$, it is possible to have a potential distribution in an R of the depletion region. In addition, by adjusting R(X), XO and V(X1) where V$_{G2}$ equals V(X1), one can adjust the field lines and voltage drops to eliminate away local crowding and local avalanche. Likewise, a step at V$\phi$(X1) can help invert the surface 65 of the substrate 15 more quickly.

Figure 32:
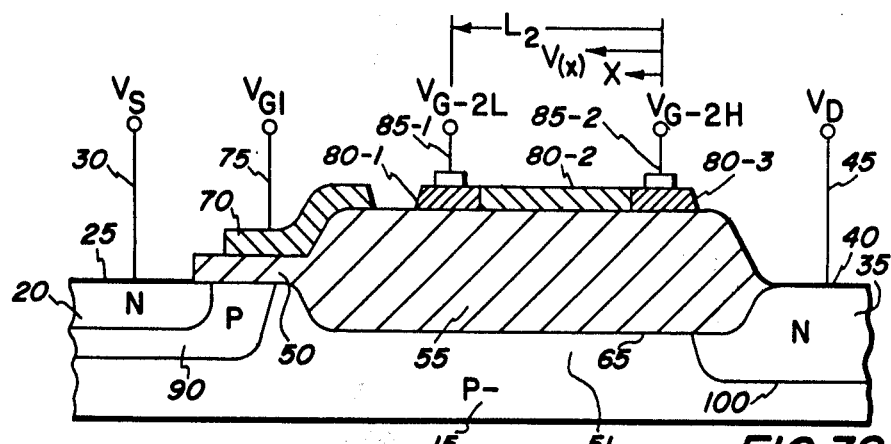
FIG. 32 is a profile view of a HVMOSFE having separate voltages in the field plate as an actual embodiment of the HVMOSFET device of FIG. 25.

In regards to a profiled field high voltage MOS structure 10 as shown in FIG. 32, it will be appreciated that instead of using several field plates 80 or multiple rings 230 as described supra, one may use a resistive gate material doped at either end (80-1 and 83) and undoped in the middle (80-2) for field plate 80. Applying separate voltage V$_{G2}$L(85-1) and V$_{G2}$H(85-2) will result in a voltage drop along along the lateral dimension of the field instead of a constant field voltage V$_{G2}$. By appropriately choosing L2 which is the field plate length (80-1 through 34), and also it's geometrical shape, one can change the shape of the field lines at the surface 65. In fact, by choosing L2 and V(X) so that S(X), the surface 65 potential due to field lines from drain area 35 and the field plate 80-1 to 3, are perpendicular to the surface 65, several problems are solved. Mainly: the breakdown voltage becomes that of a plane junction, the field across the oxide 55 is orthogonal to the surface 65 and therefore minimal thereby miniming injection into the oxide 55 and other term instabilities; device 10 structure simplification is realized; and finally, the lateral potential can be tailored exactly. A further modification of the above concept could include connecting the two gates or control gate 70 and field plate 85 thereby eliminating V$_{G2}$L(80-1).

Figure 33:
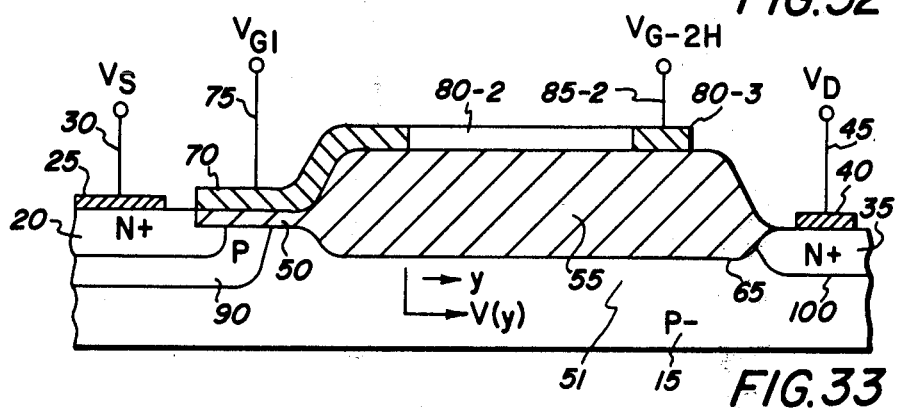
FIG. 33 is a profile view of a HVMOSFET having connectd voltages in the field plate as an actual embodiment of the HVMOSFET device of FIG. 25.

In particular, it will be noted that continuing the above concept in regards to a proportional field plate voltage distribution having a resistive gate as shown by FIG. 33, by making the first or control gate 70, VG1 havily doped poly and the same for V$_{G2}$H, which is the contact on the high side (V$_{G2}$H), and the field plate 80-2 lightly doped, a voltage drop V(X) can be achieved. When the first gate 70 is approximately zero the device 10 is off, V(X) equals V$_{G2}$HX, depending on the geometry where 0 is less than or equal to V(X) which is less than or equal to $V_{G2}H$. When the device 120 is turned on, VG1 goes to VG1H and, VG1H is less than or equal to V(X) which is less than or equal to VG2H because VG2H is much greater than VG1H (that is 500 V. versus 12 V), and the power distribution accordingly in the gate 70 doesn't charge much. In addition, because the edge of VG2L is not fixed, the changes in potential help or aide both the off condition and the on state (lower RS) for the device 10.

Variations on the supra concepts could include SiP$\phi$S and doped rings to improve the field distribution. In particular, surface geometry other than circular or rectangular could be used to give V(X) other than perpendicular or linear.

In addition, surface resistors or contact points to undoped poly to further tailor V(X) to match supra S(x) IN A DEPLETION REGION. Also in addition, doped or undoped poly could be mixed as rings of undoped poly and doped poly.

Figure 33A:
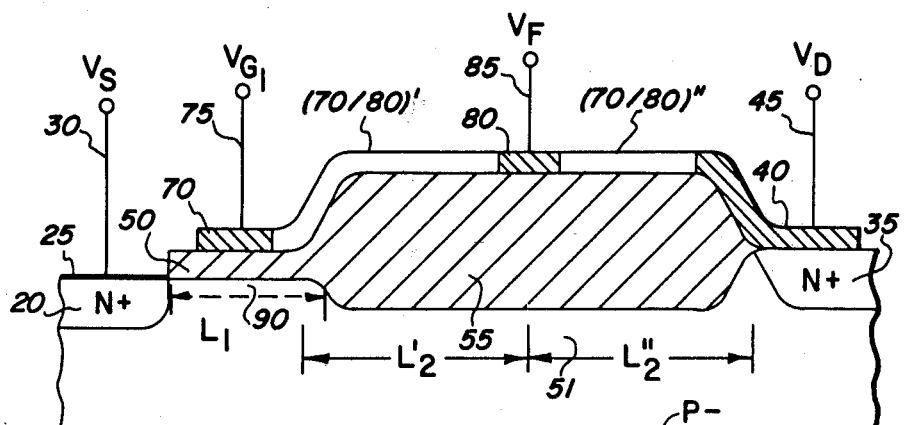
FIG. 33A is a profile view of a HVMOSFET having connected voltages in the field oxide of the HVMOSFET device of FIG. 25.

In FIG. 33A, an alternative embodiment is shown having a HVMOSFET device 10 with a graded potential field plate structure with an interim fixed potential, VF substitutes for VG2, and connecting undoped areas (70/80)' and (70/80)''. In the off mode, the voltage drops are (VD-VF) along L2'' and (VF-O) along L2'. In the on mode (VD-VF) equals approximately minus VF for L2'' and (VF-VG1) equals approximately VF where typically VG1 is less than ten volts and VF equals approximately one hundred to two hundred volts.

Figure 34:
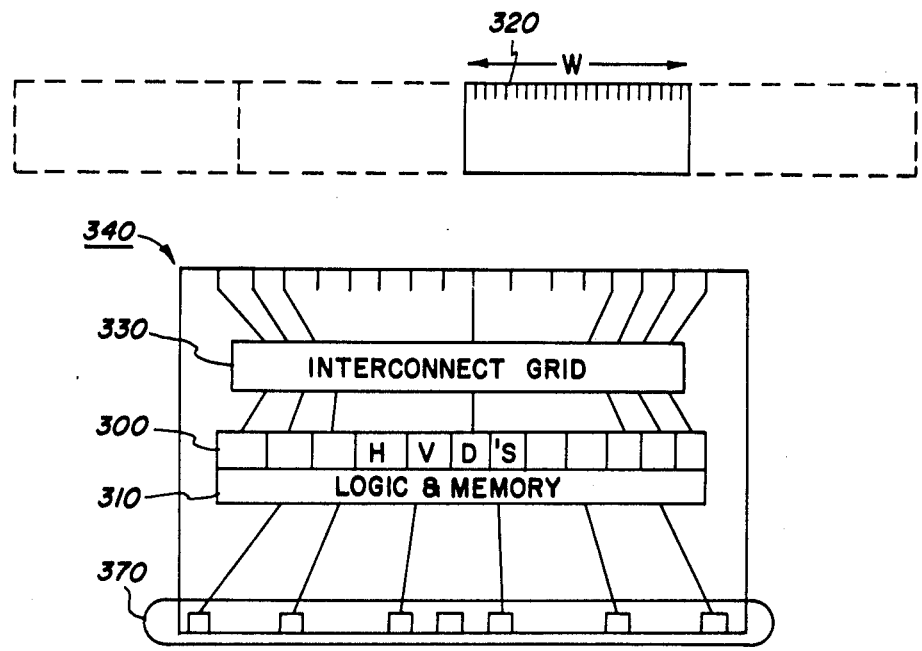
FIG. 34 is a block representation of a single print head chip using the HVMOSFET of FIG. 1.
Figure 35:
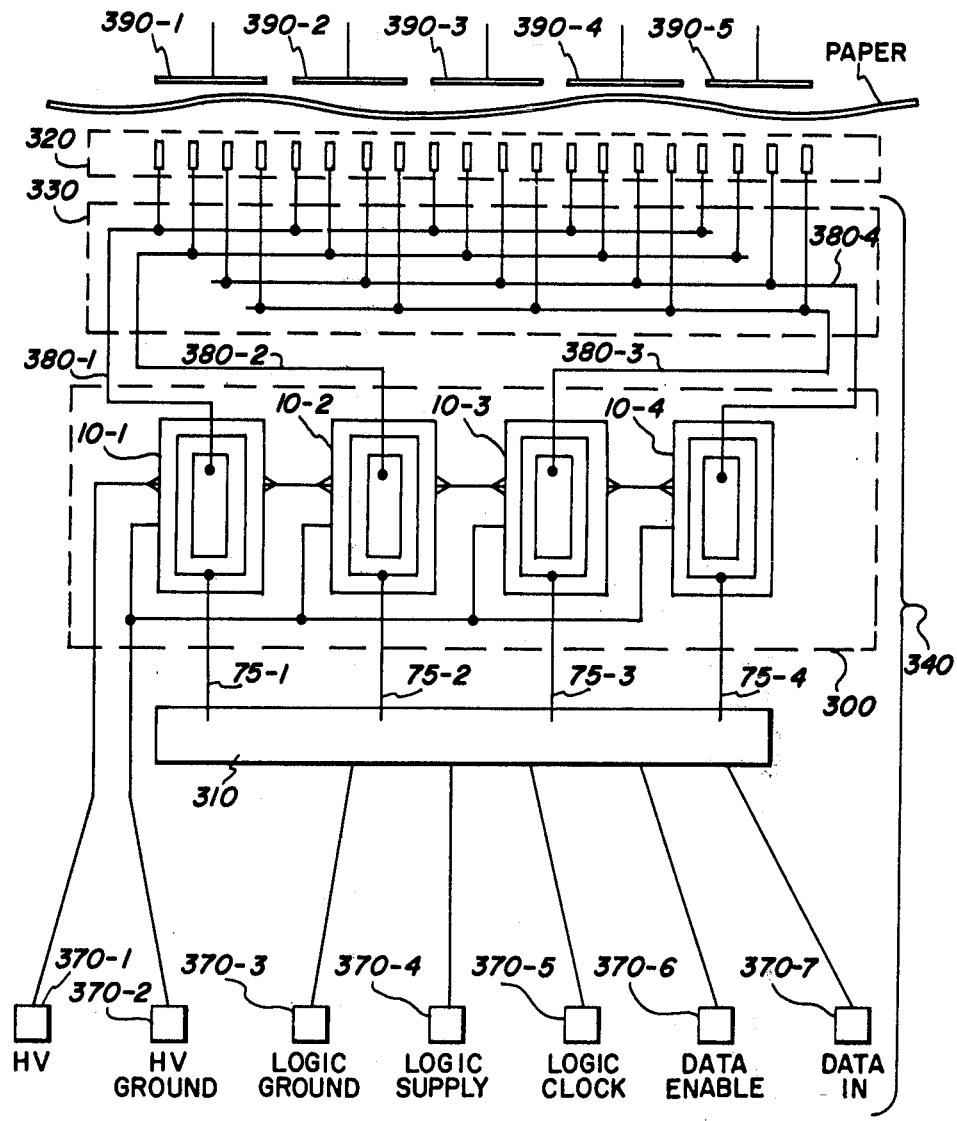
FIG. 35 is a schematic representation of the print head chip of FIG. 34.

A specific application of a HVMOSFET device 10 is as a HV driver in an array of HV drivers (HVD) 300 with on-chip logic and memory 310, on-chip (or on-substrate) writing styli (or nibs) 320 and interconnect grid 330, to form an electrographic print head 340 such as might be used in an electrostatic printer as shown in FIG. 34 for a single print head 340 generally and FIG. 35 for a single print head 340 specifically. The print head 340 would be an integrated silicon print head chip or universal building block for electrographic printers (not shown).

Figure 36:
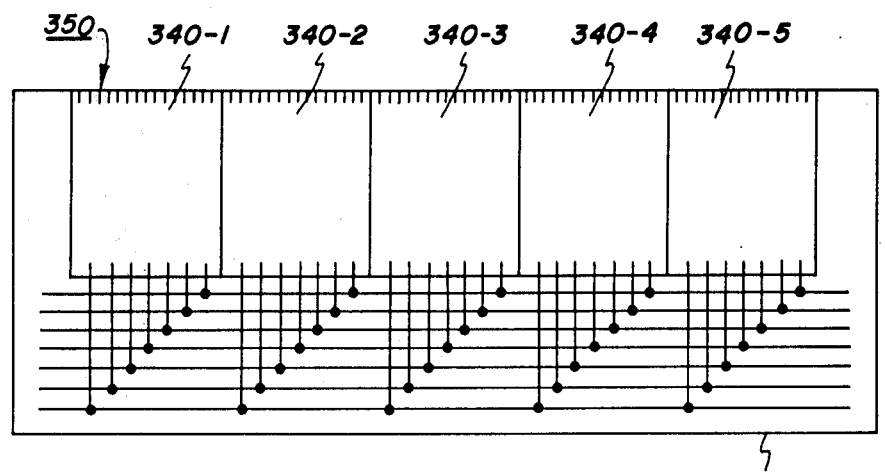
FIG. 36 is a block representation of an array of print head chips of FIG. 34.

It will be appreciated that an array 350 of print heads 340-1 to 5 on a substrate 360 as shown in FIG. 36 is composed of a number of parallel connected identical silicon chips or print heads 340 each containing all the elements of a print head such as the aforementioned nibs 320, drivers 300, logic/memory 310, interconnect 330 and also a relatively small number of inputs 370-1 to 7. As a result, the overall number of HV drivers 10 in an array 300 need no longer be minimized, as traditionally done, but rather, it may be optimized for anyone of the print heads or building block chips 340. All interconnects as represented by the interconnect grid 330 may be individualized with the chips or print heads 340 because of the close proximity of the driver and nib arrays 300, 320. Also, as a result of the relatively small number of nibs per driver, capacitive loading on every driver 10 is minimized thereby giving better performance e.g. higher speed, higher resolution, lower power, and in a specific embodiment such as an electrostatic printer giving relatively high resolution and paper speed.

Insomuch as loading capacitance is a relatively severe problem in present embodiment print heads for electrostatic printers, the present invention represents an advance over the prior art. The number of drivers 10 and nibs per chip for an array 320 as well as the on-chip interconnect 330 may be optimized for the driving-/logic architecture. Hence, power or speed therefore can be optimized separately.

It is to be appreciated that each chip or print head 340 is electrically independent as to others in the array 340. As a result, a page can be written in multiplaces simultaneously thereby enabling a multi-fold increase in writing speed. It will be further appreciated, that the print head 340 and its utilization in an electrographic printer, are independent of the nibs in an array 320 placing, that is, whether the writing nib array 320 is on the same piece of silicon as the print head 340, or on some supporting substrate.

In a particular embodiment for a print head 340 as shown in FIG. 35, high voltage (HV) is applied on input lead 370-1 to HVMOSFET drivers 10-1 to 10-4, HV ground on input lead 370-1, logic ground on input lead 370-3, logic supply (5v) on input lead 370-4, logic clock on input lead 370-5, data enable on input lead 370-6, and data-in on input lead 370-7.

In the operation thereof, a serial bit representative of the information or image that is to be printed on paper or other media is loaded into Data-In on input lead 370-7 to a conventional series/parallel shift register (not shown) that is the logic of addressing medium of the logic/memory 310. The bit stream on line 370-7 is received at the serial input of the shift register at a rate determined by the clock signal inputted to the logic-clock input lead 370-5. Conventionally tied to each of the parallel outputs of the shift register selectively for receiving "1"'s is a separate conventional latch (not shown) or memory which is clocked in at a rate also determined by the Logic-clock input lead 370-5. The control data that has been sampled is outputted from the latch when a data enable signal is received on the input lead 370-6. The latched out signal to the drivers 10 is the Vin control gate signal on lines 75-1 to 4 as described supra and shown in FIG. 24. It will also be appreciated that the Hv ground input lead 370-2 serves as functional equivalent to the ground line 30, and the HV input lead 370-1 serves as a functional equivalent to the HV line 45' also shown in FIG. 24. Thus according to the bit make up in the latched shift registers of the logic/memory 310, the array 300 of drivers 101 to 4 that have been cascaded together in parallel can be individually controlled to be either on or off at a given temporal increment. Those drivers 10-1 to 4 that are controlled to be on, out on lines 380-1 to 4 are functionally equivalent to the Vo line 45/30' as shown in FIG. 24.

The selected signals traverse the interconnect grid 330 for multiplexing into predetermined sets according to the matrix of nodes to predetermined nibs in the styli array 320. The nibs receiving the HV signal become charged one way while logic (not shown) that is conventional to electrostatic printers places an opposite charge on a selected plate of a set 390-1 to 5 oppositely adjacent to the charged nibs such that paper or other media transported there between become charged to form an image as predetermined by the information embodied in the bit stream, referred to supra.

Referring to FIG. 36, it will be appreciated that the print head chips 340 can be placed in parallel to form an array 350 with parallel inputs that are common being tied together thereby providing a minimum number of external inputs. As a result, the print head array 350 could be "N" print heads 340 in length thus giving a modular approach for a printing area of indefinite length.

What is claimed:

1. A HVMOSFET cascade switch structure having closed geometry in an integrated array on a monolithic substrate with relatively monotonicall decreasing voltage order from the center out, comprising:
   (a) first switch means having a first drain area formed in the substrate at its relative center with a relatively high voltage potential applied thereto, having a first source area formed in the substrate at its relative outer periphery at a predetermined distance and in concentric relation to the first drain, and having a first gate disposed at a predetermined distance and in concentric relation above a first channel formed in the substrate interposably at a predetermined distance and in concentric relation between the relative center and the outer periphery for connection to the first drain area for operation as an active MOS load of the structure relative to the substrate; and
   (b) second switch means having a second drain area formed in the substrate at its relative inner periphery that is operatively coincidently common with the first source area, having a fixed common ground voltage potential at a second source area formed in the substrate at the relative outer periphery at a predetermined distance and in concentric relation to the second drain, and having a second gate with a control input voltage potential applied thereto disposed at a predetermined distance and in concentric relation above a second channel formed in the substrate interposably at a predetermined distance and in concentric relation between the relative inner and outer peripheries for controlling the switching of an outputted relatively high voltage potential at the second drain area.

2. The HVMOSFET switch structure of claim 1 wherein the voltage potential decreases relatively monotonically from the relative center of said active load first switch means to said second drive switch means respectively.

3. The HVMOSFET switch structure of claim 1 further including oxide means relatively disposed over the structure for electrical isolation.

4. The HVMOSFET switch structure of claim 3 wherein said oxide means is relatively thick.

5. The HVMOSFET switch structure of claim 3 wherein said oxide means is relatively thick over said first switch active loads means and relatively split oxide over said second switch driver means.

6. The HVMOSFET switch structure of claim 5 wherein the relatively split oxide of said oxide means has a thin portion disposed over the channel area and under the second gate that is relatively adjacent to the source area at the relatively outer periphery and a thick portion disposed over the substrate between the channel area and the drain area at the relative inner periphery of said second switch driver switch means.

7. The HVMOSFET switch structure of claim 6 and 3 further including field plate means relatively disposed over the thick portion of the relatively split oxide of said oxide means and relatively interdisposed between the relative inner and outer periphery of said driver second switch means for directing field lines away from the relative inner periphery of said driver second switch means.

8. The HVMOSFET switch structure of claim 1 wherein the relative concentricity of said second driver switch means to said active load first switch means is relatively circuar circular.

9. The HVMOSFET switch structure of claim 1 wherein the relative concentricity of said driver second switch means to said active load first switch means is relatively elliptical.

* * * * *